(12) United States Patent
Ito et al.

(10) Patent No.: US 7,742,150 B2
(45) Date of Patent: Jun. 22, 2010

(54) MANUFACTURING METHOD OF SEMICONDUCTOR DEVICE

(75) Inventors: Shinichi Ito, Yokohama (JP); Kentaro Matsunaga, Kawasaki (JP); Daisuke Kawamura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 390 days.

(21) Appl. No.: 11/654,566

(22) Filed: Jan. 18, 2007

(65) Prior Publication Data
US 2007/0188733 A1 Aug. 16, 2007

(30) Foreign Application Priority Data
Jan. 20, 2006 (JP) ............... 2006-012653

(51) Int. Cl.
*G03B 27/32* (2006.01)
(52) U.S. Cl. ............... 355/77; 355/30; 355/53; 355/72
(58) Field of Classification Search ............ 355/30, 355/53, 77
See application file for complete search history.

(56) References Cited

U.S. PATENT DOCUMENTS

| | | | | |
|---|---|---|---|---|
| 7,379,157 | B2 * | 5/2008 | Nagasaka | 355/53 |
| 7,466,392 | B2 * | 12/2008 | Nagasaka et al. | 355/53 |
| 2004/0257544 | A1 * | 12/2004 | Vogel et al. | 355/30 |
| 2005/0237504 | A1 * | 10/2005 | Nagasaka et al. | 355/53 |
| 2005/0243292 | A1 * | 11/2005 | Baselmans et al. | 355/53 |
| 2005/0248741 | A1 | 11/2005 | Kawamura et al. | |
| 2006/0028630 | A1 | 2/2006 | Akimoto | |
| 2006/0044533 | A1 | 3/2006 | Ryzhikov et al. | |
| 2006/0082747 | A1 | 4/2006 | Fukuhara et al. | |
| 2006/0139593 | A1 * | 6/2006 | Nagasaka et al. | 355/53 |

(Continued)

FOREIGN PATENT DOCUMENTS

JP 10-303114 11/1998

(Continued)

OTHER PUBLICATIONS

Drag-a-drop: a characterization tool for immersion lithography Derek W. Bassett, J. Chris Taylor, Will Conley, C. Grant Willson, and Roger T. Bonnecaze Proc. SPIE vol. 6154, 61544P (Mar. 21, 2006).*

(Continued)

*Primary Examiner*—Edward J Glick
*Assistant Examiner*—Colin Kreutzer
(74) *Attorney, Agent, or Firm*—Finnegan, Henderson, Farabow, Garrett & Dunner, L.L.P.

(57) ABSTRACT

A manufacturing method of a semiconductor device including a liquid immersion movement exposure of interposing a liquid between an exposure target substrate and a projection optical system of an exposure apparatus, and carrying out an exposure processing with respect to a plurality of exposure regions set on a surface of the substrate while relatively moving the substrate with respect to the system, a first liquid immersion movement of relatively moving the substrate with respect to the system while interposing the liquid between the substrate and the system, in adjacent exposure regions of said each exposure region, and a second liquid immersion movement of relatively moving the substrate with respect to the system at a speed lower than a movement speed in the first movement, while interposing the liquid between the substrate and the system, in a distance that is longer than a movement distance in the first movement.

18 Claims, 10 Drawing Sheets

Steps of moving liquid immersion head at the time of mark reading

U.S. PATENT DOCUMENTS

2006/0194155 A1     8/2006    Kawamura et al.
2007/0110213 A1*   5/2007    Leenders et al. ............. 378/34

FOREIGN PATENT DOCUMENTS

| JP | 2004207711 A | * | 7/2004 |
| JP | 2005045232 A | * | 2/2005 |
| JP | 2005-223315 | | 8/2005 |
| WO | WO 2005/006418 A1 | | 1/2005 |
| WO | WO 2005/020299 A1 | | 3/2005 |

OTHER PUBLICATIONS

Pozrikidis, C. (2001). Fluid Dynamics—Theory, Computation, and Numerical Simulation. Springer—Verlag. pp. 525-527.*

Notification of the First Office Action mailed Aug. 8, 2008, from the State Intellectual Property Office of the People's Republic of China, for Chinese Application No. 200710004302.6.

Owa et al., "Immersion Lithography; Its Potential Performance and Issues", Proceedings of SPIE, vol. 5040, pp. 724-733, (2003).

Notice of Reasons for Rejection mailed Aug. 25, 2009, in corresponding Japanese patent application No. 2006-012653, and English-language translation of same.

Notification of Third Office Action, in a corresponding Chinese Patent Application and partial English-language translation thereof.

* cited by examiner

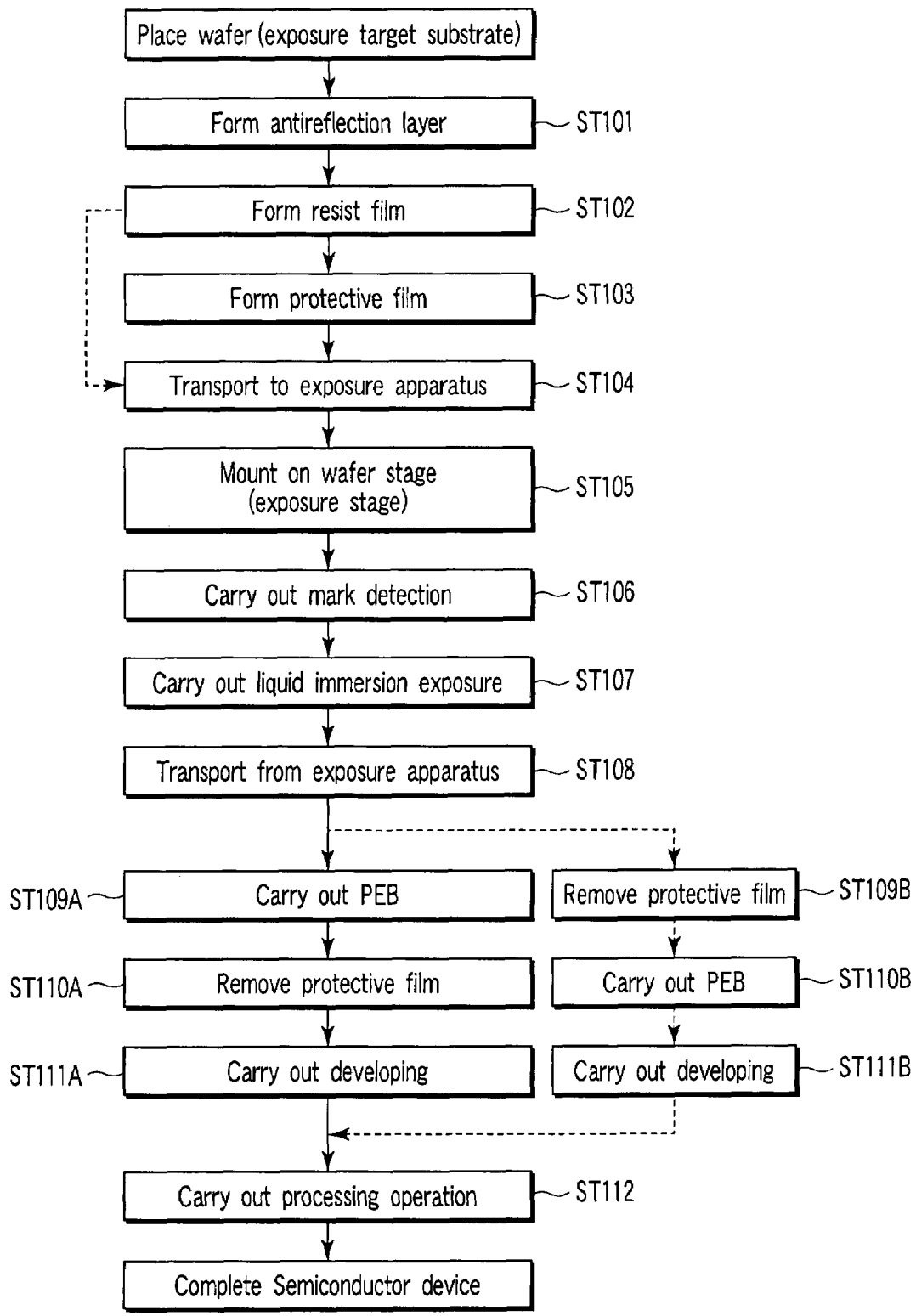
F I G. 2

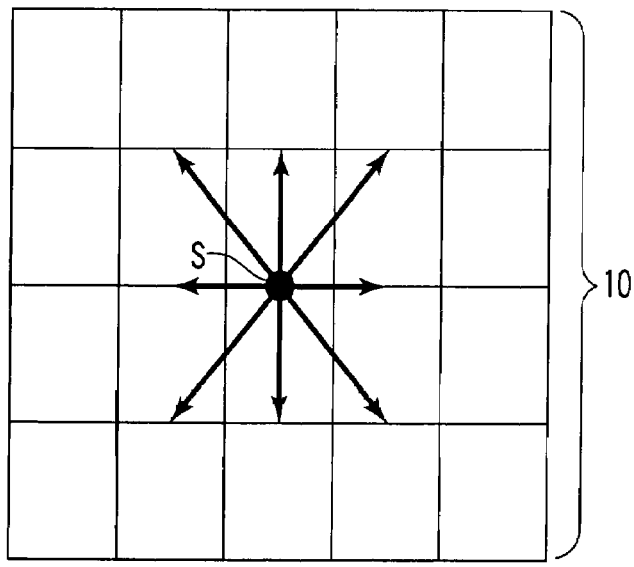
First liquid immersion movement step
(movement between adjacent exposure regions)
F I G. 4A
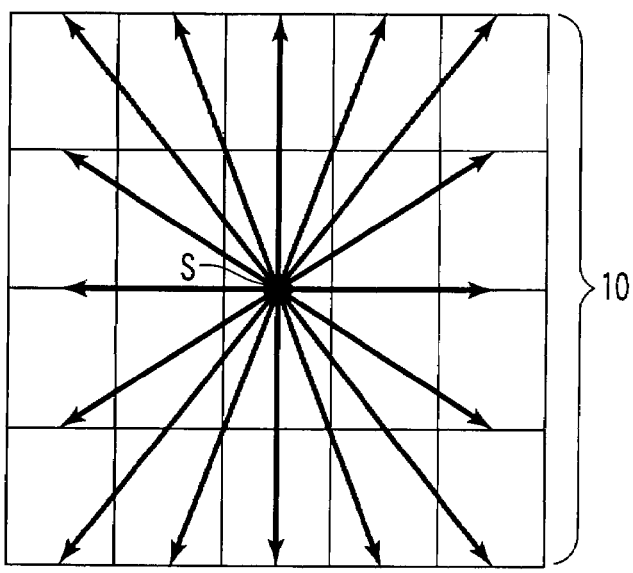
Second liquid immersion movement step
(movement across at least one exposure region)
F I G. 4B

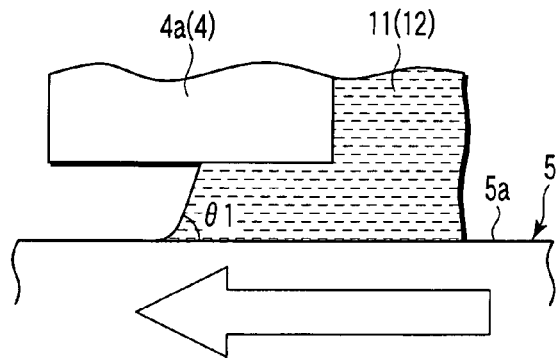

FIG. 6A

Stage movement direction
θ1= Receding contact angle

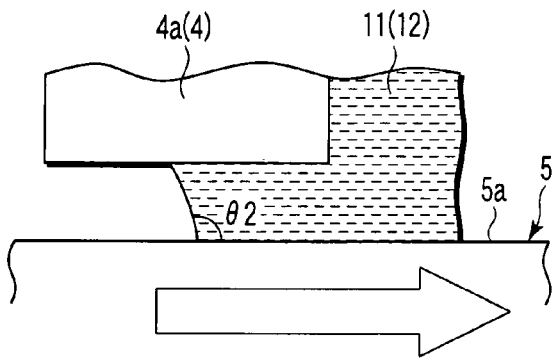

FIG. 6B

Stage movement direction
θ2= Advancing contact angle

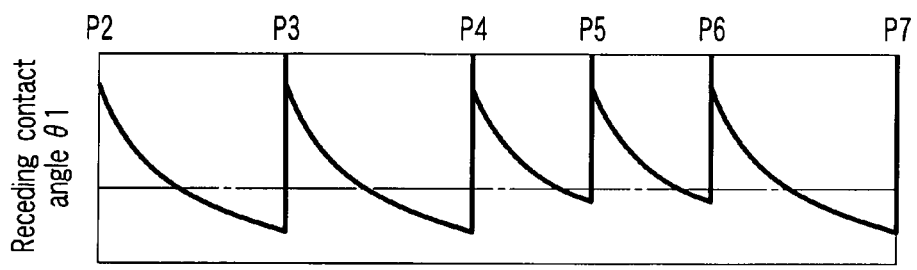

--- : Lower limit of receding contact angle at which liquid droplets occur

Relative movement distance x between liquid immersion region and processing target substrate (in the case where stage movement speed of mark evaluation step is set at maximum speed (a))

FIG. 7

--- : Lower limit of receding contact angle at which liquid droplets occur

Movement distance x
(in the case where stage movement speed of mark evaluation step is set at I liquid immersion movement exposure speed (b))

—·—: Lower limit of receding contact angle at which liquid droplets occur

Movement distance x (in the case where stage speed (for example, P2-P3) in long distance movement step is set to be further low (movement speed (c)))

Relative movement speed between liquid immersion region and processing target substrate

MANUFACTURING METHOD OF SEMICONDUCTOR DEVICE

CROSS-REFERENCE TO RELATED APPLICATIONS

This application is based upon and claims the benefit of priority from prior Japanese Patent Application No. 2006-012653, filed Jan. 20, 2006, the entire contents of which are incorporated herein by reference.

BACKGROUND OF THE INVENTION

1. Field of the Invention

The present invention relates to an exposure technique among lithography techniques for use in a process for a manufacturing method of a semiconductor device, and particularly to a manufacturing method of a semiconductor device with using a so-called liquid immersion exposure method for carrying out an exposure process while a liquid is interposed between a projection optical system of an exposure apparatus and a target substrate applied with exposure processing.

2. Description of the Related Art

Recently, attention has been focused on an exposure method referred to as a liquid immersion exposure method. This liquid immersion exposure method is provided as an exposure method for exposing a pattern on a surface of a resist film while a liquid (immersion liquid) is filled between a projection optical system (projection lens) of an exposure apparatus and a resist film or cover film on a resist film formed on an exposure target substrate applied with exposure processing. An exposure apparatus for use in this liquid immersion exposure method is referred to as a liquid immersion type exposure apparatus. One example of this liquid immersion type exposure apparatus is disclosed in Jpn. Pat. Appln. KOKAI Publication No. 10-303114.

In Jpn. Pat. Appln. KOKAI Publication No. 10-303114, there is specifically disclosed a liquid immersion type exposure apparatus for carrying out exposure while a stage is relatively moved with respect to the exposure apparatus in a state in which the whole exposure target substrate is immersed in water in a stage capable of supplying water that is an immersion liquid. In the liquid immersion exposure apparatus of such a type, there is a problem that liquid is supplied to the whole stage, and thus, an immersion liquid is prone to overflow from the stage when the stage is moved at a high speed. Therefore, the stage cannot be moved at a high speed.

As a countermeasure against problem of the liquid due to such a stage movement, a technique of moving a stage while an immersion liquid is locally supplied to a portion on an exposure target substrate at which exposure is carried out is disclosed in Soichi Owa and Hiroyuki Nagasaka, Immersion Lithography; its potential performance and issues, Proc. of SPIE Vol. 5040, pp. 724-733. According to this technique, when a stage is moved at a high speed, there is almost no risk that an immersion liquid overflows from the stage, thus enabling high-speed movement of the stage. However, in the case of using such a technique, it is necessary to provide a hydrophobic surface of a resist film, for example, in order to move a liquid film for liquid immersion exposure locally interposed on the surface of the resist film at a high speed. Alternatively, it is necessary to provide another hydrophobic film on the surface of the resist film. These processes with hydrophobic materials enable high-speed relative movement of a stage with respect to an optical system of the exposure apparatus. Finally, throughput improvement of the exposure process can be promoted.

In addition, in another liquid immersion exposure process, a movement speed of a stage in a process for moving a mere exposure target substrate that does not affect an image quality of a pattern exposed on a resist film is made higher than a movement speed of a stage in a liquid immersion movement process that affects an image quality of a pattern. That is, the movement speed of the movement process for moving a stage without exposing a pattern to a resist film is made higher than a movement speed in the liquid immersion exposure process for moving a stage while exposing a pattern onto the resist film. In this manner, throughput improvement of the exposure process can be promoted. At this time, in the movement process for moving a pattern to a resist film without exposure, of course, it is desirable to move the stage at the highest speed.

However, if the stage is simply moved at a high speed, liquid droplets of an immersion liquid are prone to remain on an exposure target substrate along a relative movement trajectory of a projection optical system and the immersion liquid of the exposure apparatus with respect to the exposure target substrate. If the liquid droplets of the immersion liquid remain on the exposure target substrate, a resist pattern formed on a resist film has defects. Consequently, in a semiconductor device manufactured based on a resist pattern having such a defect, there is a high risk that its performance, quality, reliability and the like are lowered.

BRIEF SUMMARY OF THE INVENTION

According to an aspect of the present invention, there is provided a manufacturing method of a semiconductor device comprising: a liquid immersion movement exposure of interposing a liquid between an exposure target substrate applied with exposure processing and a projection optical system of an exposure apparatus which carries out the exposure processing, and carrying out the exposure processing with respect to a plurality of exposure regions set on a surface of the exposure target substrate while relatively moving the exposure target substrate with respect to the projection optical system; a first liquid immersion movement of relatively moving the exposure target substrate with respect to the projection optical system without carrying out the exposure processing while interposing the liquid between the exposure target substrate and the projection optical system, in adjacent exposure regions of said each exposure region; and a second liquid immersion movement of relatively moving the exposure target substrate with respect to the projection optical system at a speed lower than a movement speed in the first liquid immersion movement, without carrying out the exposure processing, while interposing the liquid between the exposure target substrate and the projection optical system, in a distance that is longer than a movement distance in the first liquid immersion movement.

According to another aspect of the present invention, there is provided a manufacturing method of a semiconductor device comprising: a liquid immersion movement exposure of interposing a liquid between an exposure target substrate applied with exposure processing and a projection optical system of an exposure apparatus which carries out the exposure processing, and carrying out the exposure processing with respect to a plurality of exposure regions set on a surface of the exposure target substrate while relatively moving the exposure target substrate with respect to the projection optical system; a first liquid immersion movement of relatively moving the exposure target substrate with respect to the projection optical system without carrying out the exposure processing while interposing the liquid between the exposure target substrate and the projection optical system, in adjacent exposure regions of said each exposure region; and a second liquid immersion movement of relatively moving the exposure target substrate with respect to the projection optical system without carrying out the exposure processing while interposing the liquid between the exposure target substrate and the projection optical system, in a distance that is longer than a movement distance in the first liquid immersion movement, and changing at least one of a movement speed and a movement direction of the exposure target substrate with respect to the projection optical system before residual liquid occurs on the exposure target substrate.

According to still another aspect of the present invention, there is provided a manufacturing method of a semiconductor device comprising: a liquid immersion movement exposure of interposing a liquid between an exposure target substrate applied with exposure processing and a projection optical system of an exposure apparatus which carries out the exposure processing, and carrying out the exposure processing with respect to a plurality of exposure regions set on a surface of the exposure target substrate while relatively moving the exposure target substrate with respect to the projection optical system, wherein a movement speed of the exposure target substrate with respect to the projection optical system in the case where the liquid is positioned on a rim part of the exposure target substrate is set to be lower than a movement speed of the exposure target substrate with respect to the projection optical system in the case where the liquid is position at a part other than the rim part of the exposure target substrate.

BRIEF DESCRIPTION OF THE SEVERAL VIEWS OF THE DRAWING

FIG. 2 is a flow chart showing a liquid immersion exposure method according to the first embodiment;

FIGS. 4A and 4B are plan views each showing first and second liquid immersion movement processes according to the first embodiment;

FIGS. 6A and 6B are sectional views each showing a relationship between a movement direction of the stage according to the first embodiment and a dynamic contact angle of a liquid with respect to the wafer;

FIG. 7 is a view graphically depicting a relationship between a receding contact angle of a liquid with respect to a wafer in the case where the movement speed of the stage according to the first embodiment is set to the maximum and a relative movement distance of a liquid immersion region with respect to the wafer;

DETAILED DESCRIPTION OF THE INVENTION

Now, embodiments of the present invention will be described with reference to the accompanying drawings.

First Embodiment

A first embodiment according to the present invention will be described with reference to FIGS. 1 to 11. The present embodiment describes a resist pattern forming method capable of restraining or reducing a risk of generating a defect on a resist pattern in a liquid immersion exposure technique for carrying out pattern exposure on a local region on a substrate passing through a liquid film. Now, a detailed description thereof will be given below.

Figure 1:
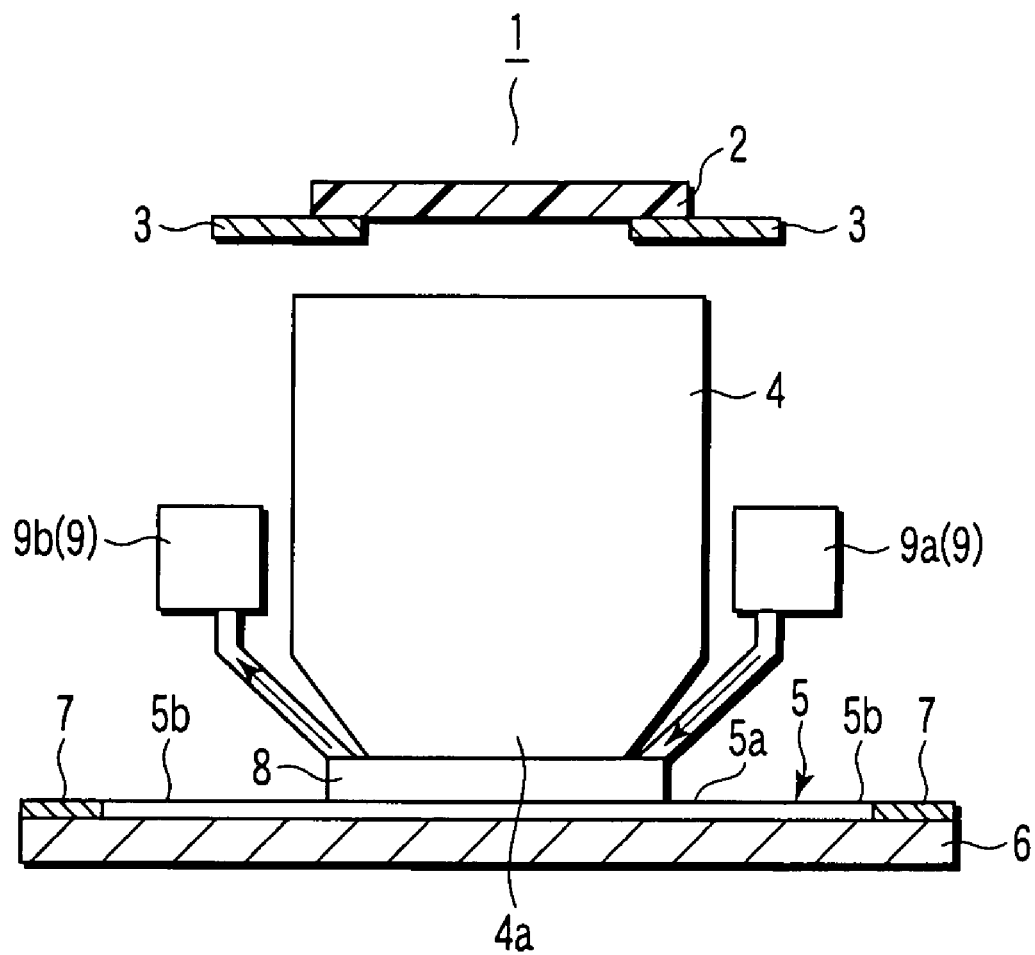
FIG. 1 is a view schematically depicting a general configuration of an exposure apparatus according to a first embodiment.

An exposure apparatus 1 according to the present embodiment will be described with reference to FIG. 1. FIG. 1 is a view schematically depicting a general configuration of the exposure apparatus 1 for carrying out exposure processing according to the present embodiment. The exposure apparatus 1 shown in FIG. 1 is provided as a liquid immersion type exposure apparatus for carrying out so-called liquid immersion exposure, the apparatus carrying out exposure in a state in which a liquid is interposed between an exposure target substrate 5 applied with exposure processing and a projection optical system 4 of the exposure apparatus 1. In particular, the liquid exposure type exposure apparatus 1 according to the present embodiment is a kind of liquid immersion type exposure apparatuses referred to as a scan type.

As shown in FIG. 1, the liquid immersion type exposure apparatus 1 is equipped with a reticle stage (mask stage) 3 serving as a reticle support element (mask support element) for supporting a reticle (mask) 2. In addition, although not shown, the liquid immersion type exposure apparatus 1 is equipped with an exposure light source (illumination light source) for generating exposure light (illumination light) and an illumination lens system (illumination optical system) for guiding the illumination light generated by the illumination light source to the reticle 2. The reticle stage 3 is disposed downwardly of an optical path of the illumination light source and the illumination lens system. In addition, the reticle stage 3 is set to be movable in a parallel forward direction or in a parallel opposite direction along a direction orthogonal to an optical axis of the liquid immersion type exposure apparatus 1. The reticle 2 is provided on a main face (surface, top face)

at a side opposite to the illumination light source and the illumination lens system of the reticle stage 3. In addition, although not shown, at least one pattern (mask pattern) made of a predetermined shape exposed and formed on a surface 5a of the exposure target substrate 5 is formed on the reticle 2.

In addition, the liquid immersion type exposure apparatus 1 is equipped with a projection lens system (projection optical system) 4 for guiding the exposure light having passed through (having transmitted) the reticle 2 to the surface 5a of the exposure target substrate 5. The projection lens system 4 is disposed downwardly of an optical path of the reticle stage 3.

In addition, the liquid immersion type exposure apparatus 1 is equipped with an exposure target substrate stage (wafer stage) 6 serving as an exposure target substrate support element (wafer support element) for supporting the exposure target substrate (wafer, semiconductor substrate) 5 applied with exposure processing. The wafer stage 6 is disposed downwardly of an optical path of the projection lens system 4. In addition, the wafer stage 6 is set to be movable in a parallel forward direction or in a parallel opposite direction together with the wafer 5 along a direction orthogonal to an optical axis of the liquid immersion type exposure apparatus 1, as in the reticle stage 3. In this manner, the wafer stage 6 and the wafer 5 placed (mounted) on the wafer stage 6 can relatively move with respect to the projection lens system 4. In addition, from an opposite point of view, the projection lens system 4 can relatively move with respect to the wafer stage 6 and the wafer 5 placed on the wafer stage 6. The wafer 5 is placed on a main face (surface, top face) of a side opposite to the projection lens system 4 of the wafer stage 6.

In addition, on a surface of the wafer stage 6, there is provided a support plate (support member) 7 serving as an exposure-target substrate holding element (wafer holding element) for holding the wafer 5 so as not to be displaced when the wafer 5 moves together with the wafer stage 6. The support plate 7 is provided to surround a rim part (outer rim part) 5b of the wafer 5.

In addition, at a bottom lens 4a of the projection lens system 4, there is provided a fence 8 serving as a liquid holding element (immersion liquid holding element) for holding a liquid (immersion liquid) for exposure processing supplied between the projection lens system 4 and the wafer 5, in a desired region on the surface 5a of the wafer 5. In addition, laterally of the projection lens system 4, there is provided a liquid supply/discharge device (immersion liquid supply/discharge device) 9 consisting of a liquid supply device 9a for supplying a liquid inside the fence 8 and a liquid discharge device 9b for discharging a liquid from the inside of the fence 8. In the present embodiment, the apparatus is set such that a liquid is supplied into the fence 8 from the liquid supply device 9a disposed at the right side of the projection lens system 4 shown in FIG. 1. In addition, the apparatus is set such that a liquid is discharged from the inside of the fence 8 by means of the liquid discharge device 9b disposed at the left side of the projection lens system 4. In the present embodiment, as an immersion liquid (first chemical), as in a general liquid immersion exposure process, ultra pure water is used. Therefore, the liquid supply/discharge device 9 is also merely referred to as a water supply/discharge device. Similarly, the liquid supply device 9a and the liquid discharge device 9b each are merely referred to as a water supply device 9a and a water discharge device 9b.

With such settings, at least at the time of carrying out liquid immersion exposure, a space enclosed by the fence 8 between the bottom lens 4a of the projection lens system 4 and the surface 5a of the wafer 5 is filled with a liquid film (water film) 11 made of ultra pure water. A region filled with the water film 11 between the projection lens system 4 and the wafer 5 is also referred to as a liquid immersion region 12. Concurrently, the bottom lens 4a of the projection lens system 4 with a fence 8 is also referred to as a liquid immersion head. In FIG. 1, liquid immersion is not shown in order to clarify drawings.

Further, although not shown, at the side of the projection lens system 4, there is provided an alignment mark detecting device for detecting an alignment mark. In this alignment mark detecting device as well, as in the projection lens system 4, the wafer stage 6 relatively moves with respect to the projection lens system 4, whereby the detecting device can relatively move with respect to the wafer stage 6 and the wafer 5. Alignment mark detection is carried out prior to applying liquid immersion exposure processing to the wafer 5, in order to enhance exposure precision.

Although not shown, the illumination light emitted from the illumination light source arrives at the reticle 2 through the illumination lens system. The illumination light having arrived at the reticle 2 passes through a mask pattern formed on the reticle 2, whereby the mask pattern is molded into a predetermined shape. Then, the illumination light (exposure light) formed in the predetermined pattern shape is incident to the projection lens system 4. The exposure light incident to the projection lens system 4 is emitted from the bottom lens 4a of the projection lens system 4, and then, passes through the liquid immersion region 12 and arrives at a desired irradiation region (exposure region) set on the surface 5a of the wafer 5. In more detail, a mask pattern image is exposed and projected onto a surface of a photo resist (not shown) provided on the surface 5a of the wafer 5, and a mask pattern latent image is formed therein. That is, liquid immersion exposure processing is applied to the surface 5a of the wafer 5.

Now, referring primarily to FIG. 2, a liquid immersion exposure method according to the present embodiment will be described. FIG. 2 is a flow chart showing a liquid immersion exposure method according to the present embodiment. First, as shown at the uppermost stage of FIG. 2, a wafer (semiconductor substrate) 5 serving as an exposure target substrate applied with exposure processing is prepared.

Next, prior to applying exposure processing, an antireflection film, although not shown, is provided in advance on the surface 5a of the wafer 5. This antireflection film is formed in accordance with a spin coat technique using a coating device, although not shown, for example. That is, a coating material for an antireflection film is dropped on a center part of the surface 5a of the rotating wafer 5, the dropped material is spread on the whole surface 5a, and then, heating processing is carried out. In this manner, the antireflection film is formed on the surface 5a of the wafer 5. In the present embodiment, an antireflection film having film thickness of about 50 nm is provided on the surface 5a of the wafer 5. This process is referred to as step 101 (ST101).

Next, a resist film, although not shown, is provided on a surface of the antireflection film. In the present embodiment, an ArF chemical amplification type resist film including an acid generation material is employed as a resist film. This resist film is formed in accordance with a method similar to the method for forming the antireflection film. That is, a coating material for the chemical amplification type resist is spread on the antireflection film in accordance with the spin coat technique. Then, heating processing is applied to the wafer 5 having provided thereon this chemical amplification type resist coating material, thereby vaporizing and removing a solvent contained in the coating material. In this manner, the ArF chemical amplification type resist film is formed on the surface of the antireflection film. This process is referred to as step 102 (ST102).

In the present embodiment, there is employed an ArF chemical amplification type resist film whose surface is comparatively hydrophilic. As described in the background technique of the invention, in general liquid immersion exposure, it is believed preferable to use a highly hydrophobic (highly hydrophobic) member that directly comes into contact with an immersion liquid provided on the wafer 5. Therefore, in the present embodiment, a hydrophobic film having dissolubility with respect to an alkaline developing solution is provided on a resist film. This film is provided to restrain moisture permeation from an immersion liquid into a resist film or elusion of a resist film constituent substance from the resist film into the immersion liquid. Thus, this film is also referred to as a liquid immersion protective film. This process is referred to as step 103 (ST103).

In addition, unlike the present embodiment, in the case where a resist film that has a highly hydrophobic surface is employed, of course, the step 103 described previously may be eliminated. In this case, as indicated by the dashed-line arrow shown in FIG. 2, the step 102 described previously may directly proceed to the step 104 described later.

Next, the wafer 5 having provided thereon the ArF chemical amplification type resist film is transported from the coating device to the liquid immersion type exposure apparatus 1 described previously. This process is referred to as step 104 (ST104).

Next, the wafer 5 transported from the coating device is placed on the wafer stage (exposure stage) 6 of the exposure apparatus 1. Then, the wafer 5 is held by means of the support plate 7. This process is referred to as step 105 (ST105).

Next, detection of an alignment mark set on the wafer 5 is carried out prior to applying liquid immersion exposure processing to the wafer 5 placed on the wafer stage 6. This alignment mark detection is carried out using an alignment mark detecting device that the exposure apparatus 1 described previously comprises. Alignment mark detection is carried out in order to enhance position precision, i.e., exposure precision of a reticle pattern projected on the wafer surface 5a (resist film surface).

In the case of detecting an alignment mark as well, as is the case of applying liquid immersion exposure processing to the wafer 5, a liquid immersion region 12 is formed in a space between the projection lens system 4 and the wafer 5. Therefore, in the alignment mark detection process as well, as in the liquid immersion exposure process, the wafer stage 6 relatively moves with respect to the projection lens system 4, and concurrently, the liquid immersion region 12 moves on the surface 5a of the wafer 5. Such relative movement of the wafer stage 6 with respect to the projection lens system 4 and liquid immersion region 12 is repeatedly carried out and an alignment mark detection function is disposed and measured at a marked position, thereby carrying out alignment mark detection. As a result, chip position information is obtained. This process is referred to as step 106 (ST106).

Next, based on the thus obtained chip position information, exposure with alignment of the wafer 5 with respect to the mask pattern is carried out. Then, a mask pattern latent image is formed on a resist film. This process is referred to as step 107 (ST107).

Next, the wafer 5 having the mask pattern latent image formed thereon is removed from the top of the stage 6, and then, the removed wafer is transferred from the exposure apparatus 1 into a processing chamber of a heater (baker), although not shown. This process is referred to as step 108 (ST108).

Next, heating processing (post exposure baking, PEB) is applied to the wafer 5 using a heater. In accordance with this heating processing, a diffusion reaction and an amplification reaction of the acid generated at the exposed area in a resist film is promoted in the liquid immersion exposure step (liquid immersion exposure stage). This process is referred to as step 109A (ST109A).

Next, the wafer 5 applied with PEB is removed from the heater. Then, a liquid immersion exposure protective film is released and removed from the top of the resist film. This process is referred to as step 111A (ST110A).

Next, the wafer 5 having removed therefrom the liquid immersion exposure protective film is transported to a developing processing device (developing unit), although not shown, and then, development processing is carried out. In this manner, an ArF resist pattern, although not shown, is formed on a resist film, while a protective film is removed from the resist film. This process is referred to as step 111A (ST111A).

Then, although a detailed and specific description with illustration is not given here, the wafer 5 having the ArF resist pattern formed thereon is fed to a predetermined processing step. That is, the wafer 5 having the ArF resist pattern formed thereon is fed to another front end of the line (FEOL) such as a transistor manufacturing process or a wire forming process. Then, the wafer 5 having undergone the FEOL is fed to a back end of the line (BEOL) such as dicing, chip mounting, bonding, molding or the like. This processing is referred to as step 112 (ST112).

Through the step 112, a desired semiconductor device, although not shown, according to the present embodiment, is provided. That is, there is provided a semiconductor device comprising a wafer 5 whose pattern is formed by a liquid immersion exposure method using the liquid immersion type exposure apparatus 1 according to the present embodiment.

In the case of using a solvent insoluble liquid immersion exposure protective film, there is no need for undergoing a process (mode, route) from the ST108 to the ST122 through the ST109A, ST110A, and ST111A described previously. As indicated by the dashed-line arrow shown in FIG. 2, without undergoing the ST109A, ST110A, and ST111A, a process from the ST108 to the ST112 through ST109B, ST110B, and ST111B can also be selected.

Specifically, the wafer 5 having undergone the ST108 is fed to a process for releasing and removing the liquid immersion exposure protective film. This process is referred to as step 109B (ST109B).

Next, the wafer 5 having removed therefrom the liquid immersion exposure protective film is fed to a PEB process. This process is referred to as step 110B (ST110B).

Next, the wafer 5 having undergone the PEB process is fed to a developing process, and then, an ArF resist pattern is formed on a resist film. This process is referred to as step 111B (ST111B).

Then, the wafer 5 having the ArF resist pattern formed thereon is fed to a processing step (ST112). In accordance with such a process as well, as is the case of selecting the process from the ST108 to the ST112 through the ST109A, ST110A, and ST111A described previously, there can be provided a semiconductor device comprising a wafer 5 whose pattern is formed in accordance with a liquid immersion exposure method using the liquid immersion type exposure apparatus 1 according to the present embodiment.

That is, as described previously, in the case of using a solvent soluble liquid immersion exposure protective film, a PEB process (ST109A) is first carried out. Then, the liquid immersion exposure protective film is released (ST110A). Then, development of a resist film (ST111A) may be carried out using an alkaline developing solution. However, this process may not always be carried out in the above order. Occasionally, the liquid immersion exposure protective film is first released using a solvent (ST109B). Then, the PEB process (ST110B) is carried out. Then, development of a resist film (ST111B) may be carried out using an alkaline developing solution.

In addition, without using the liquid immersion exposure protective film, exposure may be carried out while the liquid immersion region 12 is brought into contact with the resist film. In this case, of course, the step of releasing the liquid immersion exposure protective film (ST110A, ST109B) may be omitted.

In addition, although a detailed and specific description with illustration is not given here, the inventors carried out a prototype experiment for forming wiring on the wafer 5 having undergone the processes of the ST101 to ST108 described previously and the processes of the ST109A to ST111A or the ST109B to ST111B described previously. That is, with a resist film used as a mask, a wiring pattern was formed on the wafer 5 fabricated through each of the processes. As a result, a defect associated with the liquid immersion movement process such as a pattern short-circuit was not found. In addition, the residual liquid droplets do not permeate a resist film, and thus, a wiring pattern with better dimensional precision was successfully obtained as compared with a case of using conventional liquid immersion exposure. That is, according to the present embodiment, it was found to be possible to provide a semiconductor device having high device reliability, quality, performance and the like as compared with those of a semiconductor device according to a conventional technique. Concurrently, it was found to be possible to efficiently and easily manufacture such a semiconductor device with a high yield.

Now, with reference to FIGS. 3 to 12, a detailed description will be given with respect to relative movement between the protection lens system 4 and the liquid immersion region 12 and between the wafer stage 6 and the wafer 5 in the present embodiment.

Figure 3:
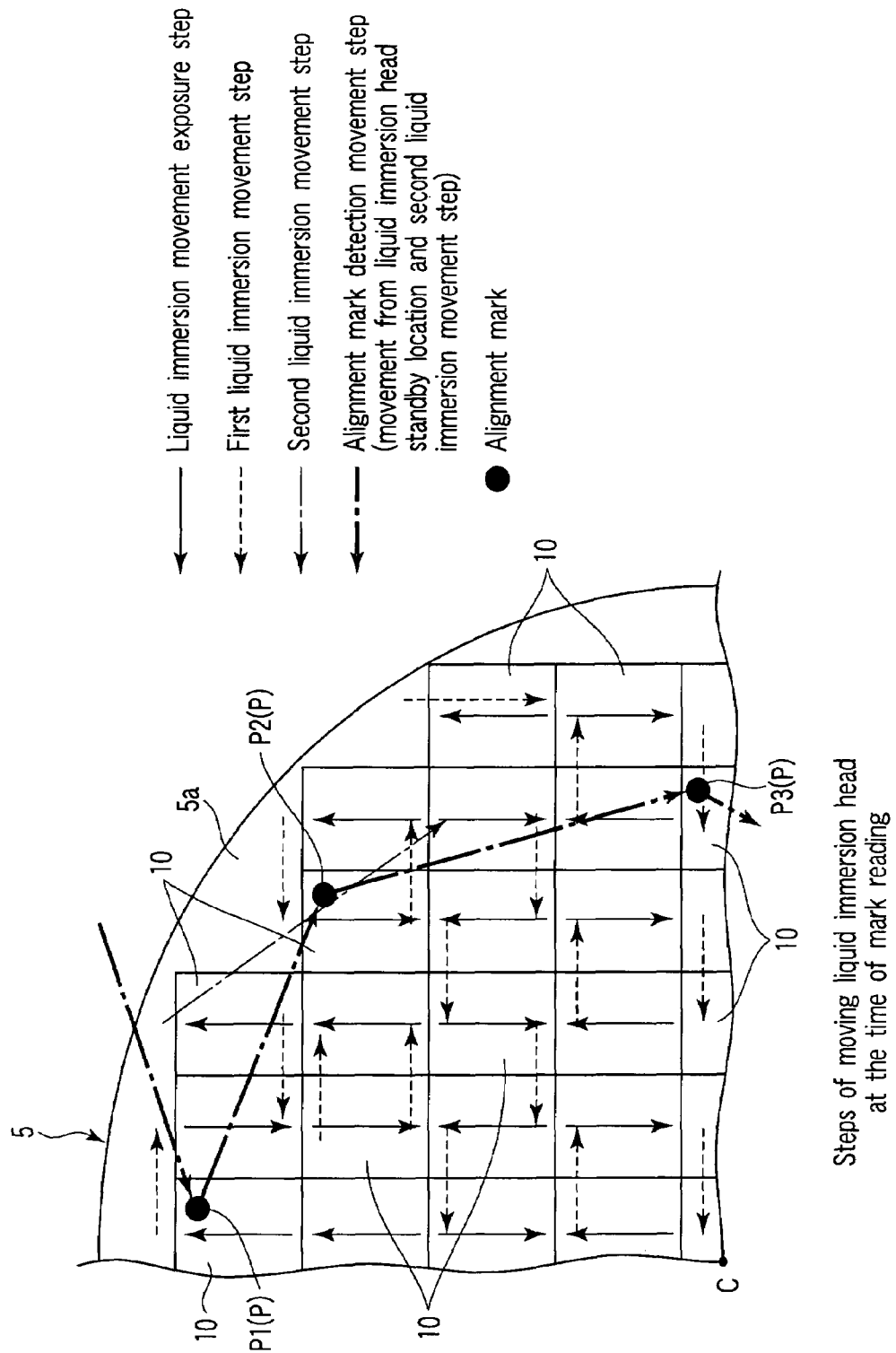
FIG. 3 is a plan view classifying, by type of movement, relative movement trajectory of a liquid immersion head with respect to a wafer according to the first embodiment according.

FIG. 3 is a plan view classifying relative movement trajectory of a liquid immersion head 4a for each movement type with respect to the wafer 5 according to the first embodiment. That is, in FIG. 3, movement trajectory of the liquid immersion region 12 set at the bottom lens 4a of the projection lens system 4 on the wafer 5 is classified according to type of movement. FIG. 3 shows only a fan shaped region including a center part C and about ¼ of an outer periphery area, among the surface 5a of the wafer 5. In addition, a plurality of rectangular (rectangle shaped) frames shown in FIG. 3 indicate a plurality of exposure regions 10 set on the surface 5a of the wafer 5. As in a general exposure process, in the present embodiment as well, an exposure process with respect to the wafer 5 (resist film) is carried out for each of the exposure regions 10. In addition, the filled circles shown in FIG. 3 indicate positions P of a plurality of alignment marks set on the surface 5a of the wafer 5. FIG. 3 shows positions of three alignment marks P1 to P3 among respective alignment marks P. Further, a plurality of arrows indicated by the solid line, a plurality of arrows indicated by the dashed line, and a plurality of arrows indicated by the alternate single dot and chain line each indicate trajectory when the center of the projection lens system 4 (center of first liquid film) relatively moves with respect to the wafer 5. Now, a specific description will be given below.

A plurality of arrows indicated by the solid line shown in FIG. 3 represent movement trajectory of a center part of the liquid immersion head 4a (liquid immersion region 12) on the wafer 5 when liquid immersion exposure processing is applied to each exposure region, 10 while the wafer 5 is relatively moved with respect to the projection lens system 4. In the following description, it is assumed that the movement process of the liquid immersion head 4a at the time of carrying out such liquid immersion exposure processing is referred to as a liquid immersion movement exposure process. In addition, a plurality of arrows indicated by the dashed lines shown in FIG. 3 represent movement trajectory of a center part of the liquid immersion head 4a on the wafer 5 when the wafer 5 is relatively moved with respect to the projection lens system 4 without carrying out exposure processing while an immersion liquid is interposed between the wafer 5 and the projection lens system 4 among the adjacent exposure regions 10. In the following description, it is assumed that the movement process of the liquid immersion head 4a without liquid immersion exposure processing among such adjacent exposure regions 10 is referred to as a first liquid immersion movement process.

In addition, a plurality of arrows indicated by the alternate fine single dot and chain line shown in FIG. 3 represent movement trajectory of a center part of the liquid immersion head 4a on the wafer 5 while the wafer 5 is relatively moved with respect to the projection lens system 4 without carrying out exposure processing while an immersion liquid is interposed between the wafer 5 and the projection lens system 4 in a distance that is longer than the movement distance of the liquid immersion head 4a in the first liquid immersion movement process. Specifically, a plurality of arrows indicated by the alternate fine single dot and chain line shown in FIG. 3 represent movement trajectory of a center part of the liquid immersion head 4a having encompassed at least one exposure region 10. In the following description, such movement process of the liquid immersion head 4a without liquid immersion exposure processing in movement in a distance that is longer than the movement distance of the first liquid immersion movement process is referred to as a second liquid immersion movement process.

In addition, a plurality of arrows indicated by the alternate thick single dot and chain line shown in FIG. 3 represent movement trajectory of a center part of the liquid immersion head 4a on the wafer 5 at the time of checking the alignment marks P1, P2, and P3. As shown in FIG. 3, the alignment marks P1 to P3 are set at distant positions through a plurality of exposure regions 10 each other on the surface 5a of the wafer 5. Therefore, the movement process of the liquid immersion head 4a in the alignment mark detection process is also classified into one kind of the second liquid immersion movement process.

Now, with reference to FIGS. 4A and 4B, definitions of the first and second liquid immersion movement processes will be described specifically and in detail. FIGS. 4A and 4B are plan views each showing the first and second liquid immersion movement processes according to the present embodiment. Specifically, FIG. 4A shows an example of a movement direction and a movement distance of the liquid immersion head 4a (liquid immersion region 12) in the first liquid immersion movement process. In addition, FIG. 4B shows an example of a movement direction and a movement distance of the liquid immersion head 4a in the second liquid immersion movement process. In addition, in FIGS. 4A and 4B, the portions enclosed by a plurality of rectangular (rectangle shaped) frames indicate a plurality of exposure regions (liquid immersion movement exposure regions) 10 set on the surface 5a of the wafer 5, respectively.

As shown in FIG. 4A, in the first liquid immersion movement process, the immersion head 4a moves within the liquid immersion movement exposure region 10 in which a reference point (start point) S is provided. Alternatively, the liquid immersion head 4a moves from the reference point S into the liquid immersion movement exposure region 10 adjacent to the liquid immersion movement exposure region 10 in which the reference point S is provided. At this time, the liquid immersion head 4a moves in any one of a longitudinal direction (vertical direction), a transverse direction (horizontal direction), and an oblique direction shown in FIG. 4A with respect to the reference point S.

In addition, as shown in FIG. 4B, in the second liquid immersion movement process, the liquid immersion head 4a moves from a reference point S across at least a liquid immersion movement exposure region 10 adjacent to another liquid immersion movement exposure region 10 in which the reference point S is provided. That is, unlike the first liquid immersion movement process, in this second liquid immersion movement process, the liquid immersion head 4a moves from the reference point S to a distant position across at least one liquid immersion movement exposure region 10. However, as in the first liquid immersion movement process, in this second liquid immersion movement process as well, the liquid immersion head 4a moves in any one of the longitudinal direction (vertical direction), a transverse direction (horizontal direction), and an oblique direction shown in FIG. 4B with respect to the reference point S.

Figure 5:
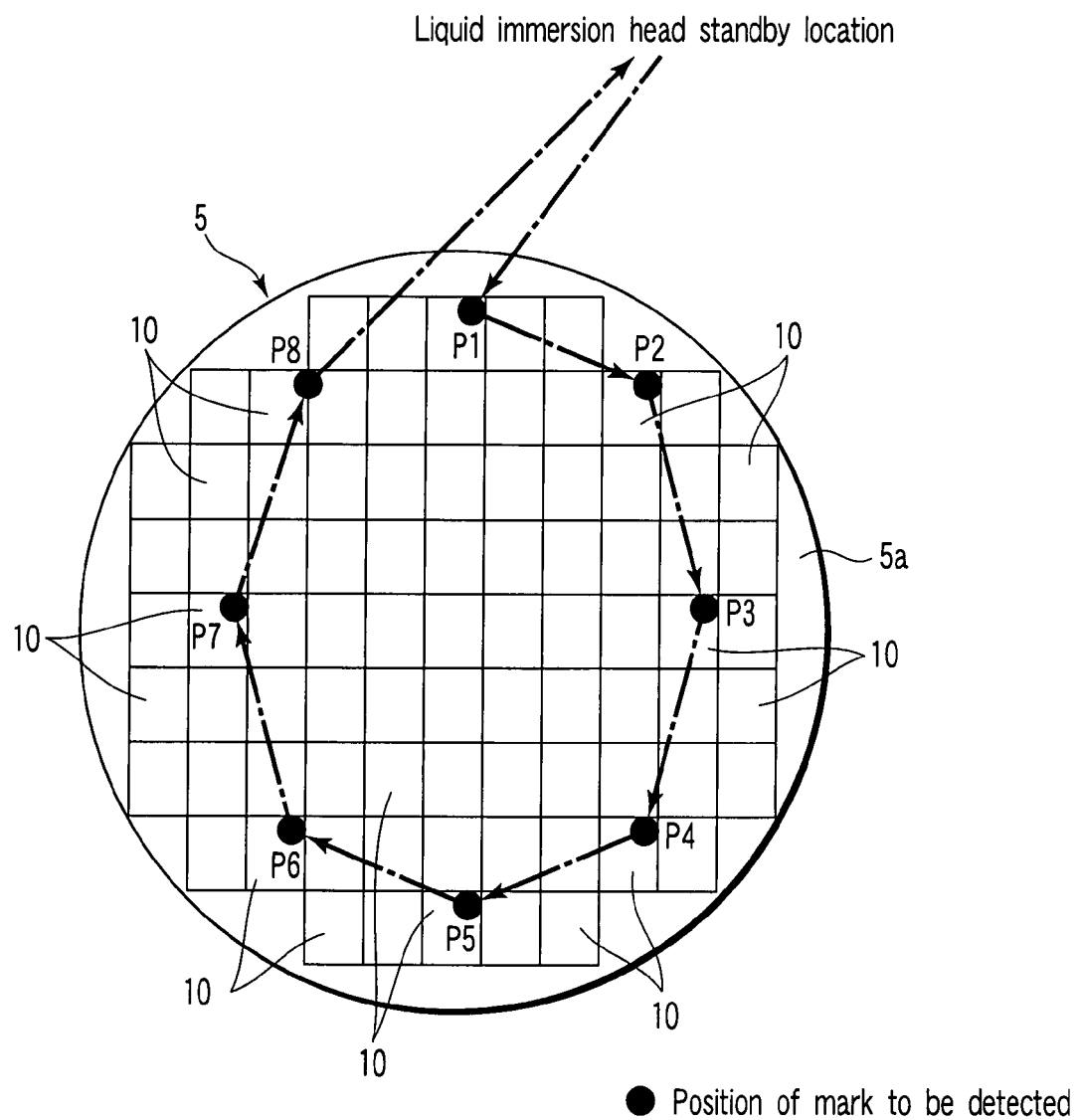
FIG. 5 is a plan view showing movement trajectory at the time of detecting an alignment mark of a liquid immersion head with respect to the wafer according to the first embodiment.

With reference to FIG. 5, a description will be given with respect to a movement process of the liquid immersion head 4a at the time of detecting an alignment mark. FIG. 5 is a plan view showing movement trajectory at the time of detecting an alignment mark of the liquid immersion head 4a with respect to the wafer 5 according to the present embodiment. FIG. 5 schematically depicts trajectory of relative movement of a center in the liquid immersion region 12 (liquid immersion head 4a) with respect to the wafer 5 at the time of checking alignment marks P1 to P8 set in the surface 5a of the wafer 5. A plurality of arrows indicated by the alternate single dot and chain line shown in FIG. 5 represent movement trajectory of the center in the liquid immersion head 4a at each time of detection of an alignment mark, respectively.

As shown in FIG. 5, when alignment mark detection is started, the liquid immersion head 4a moves from a liquid immersion head standby location (liquid immersion head standby position), although not shown, which is set at the outside of the wafer 5, to a first alignment mark P1, in order to detect the first alignment mark P1. After the first alignment mark P1 has been detected, the liquid immersion head 4a repeats a similar process with respect to a second alignment mark P2 to an eighth alignment mark P8. After the eighth alignment mark P8 has been detected, the liquid immersion head 4a returns to the liquid immersion head standby location. As is evident from a length of each of the alternate single dot and chain lines shown in FIG. 5, in the present embodiment, movement of the liquid immersion head 4a corresponds to movement across at least one of all of the liquid immersion movement exposure regions 10. Therefore, all of the movement processes of the liquid immersion head 4a at the time of detecting an alignment mark can be regarded as the second liquid immersion movement process, as described previously.

As described in the background technique of the invention, in a liquid immersion movement process at the time of non-exposure, a movement speed of a stage (wafer) hardly affects a quality of a resist latent image. Therefore, conventionally, a stage has been moved at a maximum speed in order to enhance throughput of an exposure process. However, in that case, there has occurred a problem that liquid droplets remain on a wafer along the movement trajectory of the liquid immersion region 12. In contrast, in a liquid immersion movement exposure process in an exposure region in which a stage is moved at a lower speed than that in the liquid immersion movement process at the time of non-exposure, the residual liquid droplets are hardly observed. Now, this mechanism will be described specifically and in detail with reference to FIGS. 6A to 11.

Now, with reference to FIGS. 6A and 6B, a description will be given with respect to a definition of a dynamic contact angle between the wafer 5 and an immersion liquid 11. FIGS. 6A and 6B are sectional views each showing a relationship between a movement direction of the stage 6 and a dynamic contact angle of the liquid 11 with respect to the wafer 5 according to the present embodiment. Specifically, FIG. 6A is an illustration adapted to explain a receding contact angle $\theta 1$ between the wafer 5 and the immersion liquid 11. FIG. 6B is an illustration adapted to explain a advancing contact angle $\theta 2$ between the wafer 5 and the immersion liquid 11.

As indicated by the open arrow shown in FIG. 6A, the wafer 5 placed on the stage 6 is moved in the leftward direction shown in FIG. 6A. Then, a portion positioned frontally in the stage movement direction, among the immersion liquid 11 provided in the liquid immersion region 12 between the liquid immersion head 4a and the wafer 5 is formed in the shape as shown in FIG. 6A at the time of starting this stage movement. In such a state, the angle indicated by $\theta 1$ shown in FIG. 6A is defined as a dynamic receding contact angle between the wafer 5 and the immersion liquid 11. In addition, as indicated by the open arrow shown in FIG. 6B, the wafer 5 placed on the stage 6 is moved in the rightward direction shown in FIG. 6B. Then, a portion positioned backwardly in the stage movement direction, among the immersion liquid 11 provided in the liquid immersion region 12 between the liquid immersion head 4a and the wafer 5, is formed in the shape as shown in FIG. 6B at the time of starting this stage movement. In such a state, the angle indicated by $\theta 2$ shown in FIG. 6B is defined as a dynamic advancing contact angle between the wafer 5 and the immersion liquid 11. In general, among the two dynamic contact angles, the receding contact angle $\theta 1$ and the advancing contact angle $\theta 2$, it is said that, as the receding contact angle $\theta 1$ is smaller, the immersion liquid 11 is more likely to have affinity with the wafer 5 and the residual droplets easily occur.

Now, with reference to FIG. 7, a description will be given with respect to a change of the receding contact angle $\theta 1$ in an alignment mark detection process (evaluation process). More specifically, a description will be given with respect to a result obtained by the inventors investigating a change of the receding contact angle $\theta 1$ of the immersion liquid 11 in the case where a movement speed of the stage 6 has been set to the maximum speed at the time of evaluation of an alignment mark. FIG. 7 is a view graphically depicting a relationship between the receding contact angle $\theta 1$ of the immersion liquid 11 with respect to the wafer 5 and a relative movement distance of the immersion liquid 11 with respect to the wafer 5 in the case where the movement speed of the stage 6 according to the present embodiment is set to the maximum. FIG. 7 graphically depicts a relationship between the receding contact angle $\theta 1$ in the movement processes from the second to seventh alignment marks P2 to P7 and a relative movement distance of the immersion liquid 11 with respect to the wafer 5, among the movement processes from the first to eighth alignment marks P1 to P8 shown in FIG. 5 previously referred to.

According to the graph shown in FIG. 7, at any one of the movement intervals from the second alignment mark 2 to the seventh alignment mark P7, it was found that, at the latter half of the movement process, the receding contact angle $\theta 1$ is lower than a threshold value at which the residual liquid droplets occur on the surface 5a of the wafer 5. That is, at any one of the movement intervals from the second alignment mark 2 to the seventh alignment mark P7, it was found that, at the latter half of the movement process, liquid droplets remain on the surface 5a of the wafer 5.

Figure 8:
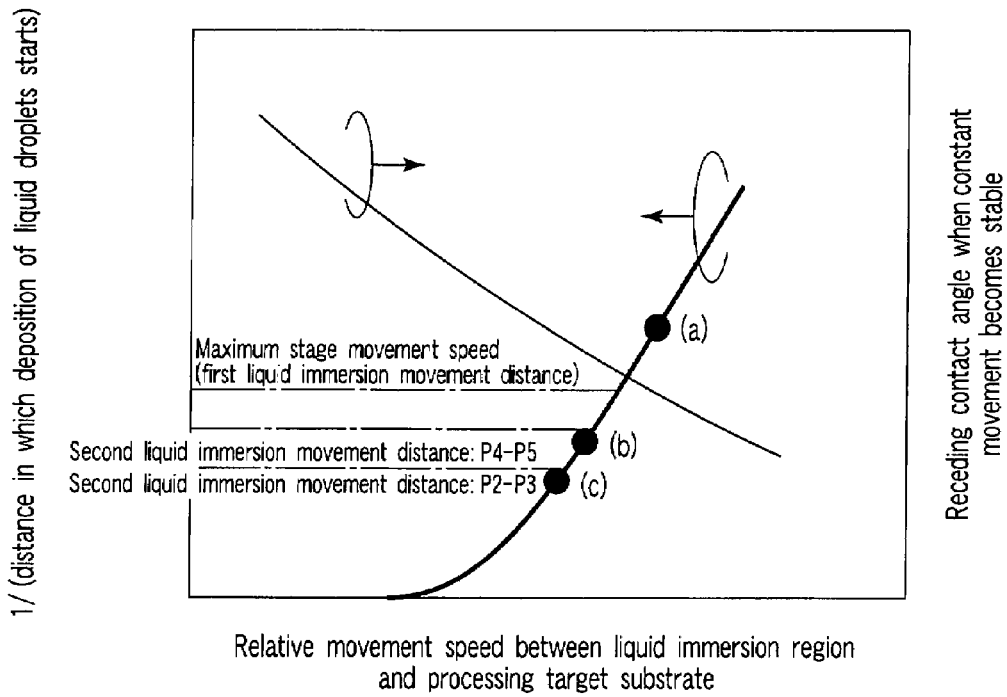
FIG. 8 is a view graphically depicting a relationship between the residual liquid droplet generation distance with respect to a relative movement speed between the liquid immersion region and the wafer according to the first embodiment and a receding contact angle of a liquid with respect to the wafer.

Next, with reference to FIG. 8, a description will be given with respect to a result obtained by the inventors investigating a relationship between the residual liquid droplet generation distance and the receding contact angle $\theta 1$ with respect to a relative movement speed between the immersion liquid 11 (liquid immersion region 12) and the wafer 5. FIG. 8 is a view graphically depicting a relationship between the residual liquid droplet generation distance with respect to a relative speed between the liquid immersion region 12 and the wafer 5 according to the present embodiment and the receding contact angle $\theta 1$ of the immersion liquid 11 with respect to the wafer 5. More specifically, FIG. 8 graphically depicting, by the fine solid line, a relationship between a relative speed between a liquid immersion exposure protective film and a liquid immersion region 12, the protective film being provided on an ArF chemical amplification type resist film provided on the surface 5a of the wafer 5; and the dynamic receding contract angle $\theta 1$ after the wafer 5 has entered a constant speed movement state and an angle has been stabilized. In addition, FIG. 8 graphically depicts, by the thick solid line, a relationship between a relative speed between the liquid immersion exposure protective film and the liquid immersion region 12 and an inverse number of a movement distance in which the residual liquid droplets occur.

According to the graph indicated by the thick solid line shown in FIG. 8, in the case where a relative speed between the liquid immersion exposure protective film and the liquid immersion region 12 is the maximum movement speed (a) of the stage 6, it was found that the residual liquid droplets occur at a value equal to or smaller than the maximum value of the movement distance (second liquid immersion movement distance) of the liquid immersion head 4a in the alignment mark evaluation process described previously. In addition, according to the graph indicated by the thick solid line shown in FIG. 8, in the case where a relative speed between the liquid immersion exposure protective film and the liquid immersion region 12 is set at the maximum movement speed (a) of the stage 6, it was found that the residual liquid droplets occur in a distance that is shorter than the movement distance of the liquid immersion head 4a in the first liquid immersion movement process descried previously.

In view of these results, the inventors predicted that the residual liquid droplets occur also in the case where a second liquid immersion movement process is carried out at a movement speed (b) of the liquid immersion head 4a in a liquid immersion movement exposure process. According to a verification experiment that the inventors carried out with respect to this prediction, when the movement speed of the liquid immersion head 4a at the time of evaluation of an alignment mark was actually set at the movement speed in the liquid immersion movement exposure process, the residual liquid droplets were eliminated at an interval at which the movement distance is comparatively short, like P4 to P5, for example, whereas the residual liquid droplets were observed at an interval at which the movement distance is comparatively long, like P2 to P3, for example.

Figure 9:
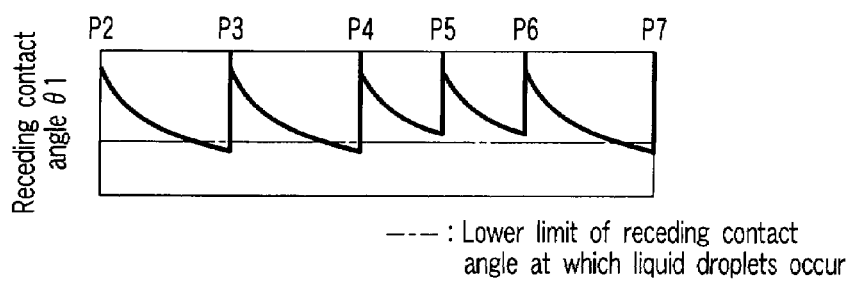
FIG. 9 is a view graphically depicting a relationship between a receding contact angle of a liquid with respect to a wafer in the case where a movement speed of the stage according to the first embodiment is lower than a maximum movement speed and a relative movement distance of the wafer with respect to a liquid immersion region.

Now, with reference to FIG. 9, a description will be given with respect to a result obtained by the inventors investigating a change of the receding contact angle $\theta 1$ in the case where a movement speed of the stage 6 has been set at a speed in a liquid immersion movement exposure process. That is, a description will be given with respect to a result obtained by the inventors investigating a change of the receding contact angle $\theta 1$ in the case where a second liquid immersion movement process has been carried out at a speed equal to that of the liquid immersion movement exposure process. FIG. 9 is a view graphically depicting a relationship between the receding contact angle $\theta 1$ of the immersion liquid 11 with respect to the wafer 5 and a relative movement distance of the wafer 5 with respect to the immersion liquid 11 in the case where the movement speed of the stage 6 according to the present embodiment has been set to be lower than the maximum speed, specifically at the movement speed (b) in FIG. 8. In addition, in FIG. 9, as in FIG. 7 previously referred to, there is graphically depicted a relationship between the receding contact angle $\theta 1$ in movement processes from the second to seventh alignment marks P2 to P7 and a relative movement distance of the liquid immersion region 12 with respect to the wafer 5, among the movement processes from the first to eighth alignment marks P1 to P8.

According to this graph shown in FIG. 9, at an interval at which a movement distance is comparatively small (short) among the movement intervals from the second alignment mark P2 to the seventh alignment mark P7, it was found that the receding contact angle $\theta 1$ always exceeds a lower limit (threshold value) at which the residual liquid droplets occur. Specifically, among the movement intervals from the second alignment mark P2 to the seventh alignment mark P7, at each of the movement intervals from the fourth alignment mark P4 to the fifth alignment mark P5 and from the fifth alignment mark P5 to the sixth alignment mark P6, it was found that the receding contact angle $\theta 1$ always exceeds a threshold value at which the residual liquid droplets occur.

In contrast, at an interval at which a movement distance is comparatively large (long) among the movement intervals from the second alignment mark P2 to the seventh alignment mark P7, it was found that, at the end of each of the movement processes, a receding contact angle $\theta 1$ is lower than a threshold value at which the residual liquid droplets occur. Specifically, among the movement intervals from the second alignment mark P2 to the seventh alignment mark P7, at each of the movement intervals from the second alignment mark 2 to the third alignment mark P3, the third alignment mark P3 to the fourth alignment mark P4, and the sixth alignment mark P6 to the seventh alignment mark P7, it was found that, at the end of each of the movement processes, the receding contact angle $\theta 1$ is lower than a threshold value at which the residual liquid droplets occur. In addition, although a detailed description with illustration is not given here, in accordance with a defect evaluation experiment carried out by the inventors as well, an evidence indicating that liquid droplets seemed to remain on each of the exposure regions 10 was verified at each of the movement intervals from the second alignment mark P2 to the third alignment mark 3, the third alignment mark P3 to the fourth alignment mark P4, and the sixth alignment mark P6 to the seventh alignment mark P7.

In general, a value of the dynamic receding contact angle $\theta 1$ rapidly changes and decreases from a value of a static contact angle, although not shown, when the stage 6 (wafer 5)

is accelerated. In addition, even after the routine is moved from the accelerating movement of the stage 6 to a constant speed movement, the value of the dynamic receding contact angle θ1 continues to change gradually due to viscosity of the immersion liquid 11 per se or a friction between the immersion liquid 11 and the surface 5a of the wafer 5 or the like. In the liquid immersion movement exposure process described previously, as shown in FIGS. 3 and 4A, a constant speed movement interval of the stage 6 is shorter than that in the second liquid immersion movement process. Thus, in the course of the dynamic receding contact angle θ1 changing gradually, the stage 6 moves to a decelerating movement that is a next movement. For this reason, in the case where the movement speed of the stage 6 is equally set in magnitude, in the liquid immersion movement exposure process, the magnitude of the dynamic receding contact angle θ1 is easily maintained at a high value that exceeds a threshold value at which the residual liquid droplets occur, as compared with the second liquid immersion movement process that is longer in movement distance than that in the liquid immersion movement exposure process.

As a result, in the case of executing relative movement in long distance between the stage 6 (wafer 5) and the immersion liquid 11 (liquid immersion region 12), it was found to be preferable to determine the movement speed of the stage 6 in consideration of the fact that the dynamic receding contact angle θ1 continues to change gradually due to viscosity of the immersion liquid 11 per se or a friction between the immersion liquid 11 and the surface 5a of the wafer 5 or the like. Specifically, in the case of executing relative movement in long distance between the wafer 5 and the liquid immersion region 12, it was found to be preferable to set the movement speed of the stage 6 lower than that of the stage 6 in the liquid immersion movement exposure process. In this manner, even in the second liquid immersion movement process that is longer in movement distance than that in the liquid immersion movement exposure process, the magnitude of the dynamic receding contact angle θ1 can be maintained at a magnitude that is not lower than a lower limit of a contact angle at which liquid droplets remain. That is, the invention according to the present embodiment can eliminate most of the residual liquid droplets that have almost always occurred conventionally in the liquid immersion movement process at the time of non-exposure.

For example, in an alignment mark evaluation process, among the movement intervals from the first alignment mark P1 to the eighth alignment mark P8 shown in FIG. 5, the movement speed of the stage 6 at an interval at which a movement distance is comparatively long is set at a movement speed (c) in consideration of a relationship indicated by the thick solid line graph shown in FIG. 8. Specifically, in the alignment mark evaluation process, the movement speed of the stage 6 is set to the movement speed (c) in movement intervals other than three intervals: from the first alignment mark P1 to the second alignment mark P2; the fourth alignment mark P4 to the fifth alignment mark P5; and the fifth alignment mark P5 to the sixth alignment mark P6 at which the movement distance is comparatively short, among the movement intervals from the first alignment mark P1 to the eighth alignment mark P8.

Figure 10:
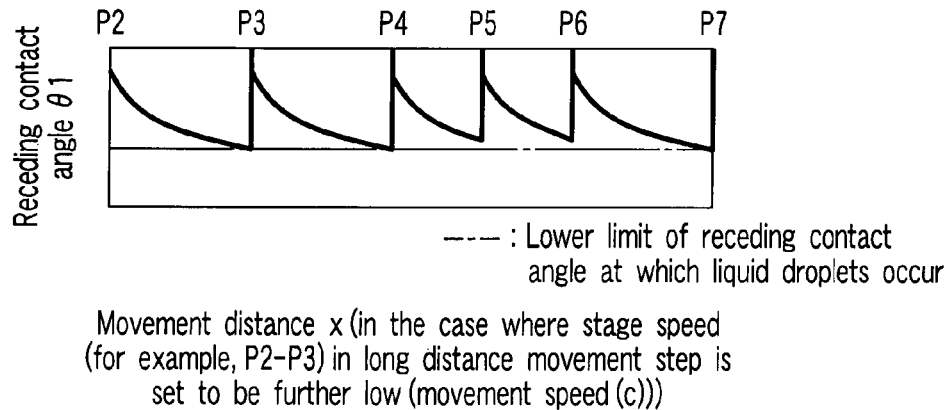
FIG. 10 is a view graphically depicting a relationship between a receding contact angle of a liquid with respect to a wafer in the case where a movement speed of the stage according to the first embodiment is further lower than a maximum movement speed and a relative movement distance of the wafer with respect to a liquid immersion region.

As a result of the inventors carrying out experiment under such settings, as shown in FIG. 10, in the alignment mark evaluation process as well as in the liquid immersion movement exposure process, it was found to be possible to always maintain the value of the dynamic receding contact angle θ1 at each movement interval from the second alignment mark P2 to the seventh alignment mark P7 at a value equal to or greater than a lower limit of the residual liquid droplets. That is, it was found that the residual liquid droplets in liquid immersion movement of a long distance can be substantially 0. FIG. 10 is a view graphically depicting a relationship between the receding contact angle θ1 of the immersion liquid 11 with respect to the wafer 5 and a relative movement distance of the wafer 5 with respect to the liquid immersion region 12 in the case where a movement speed of the stage 6 according to the present embodiment is further lower than a maximum movement speed. That is, FIG. 10 graphically depicts how a value of the dynamic receding contact angle θ1 changes in the case where a movement speed of the stage 6 in the second liquid immersion movement process (alignment mark evaluation process) has been determined in consideration of a relative movement distance between the stage 6 and the liquid immersion region 12.

Figure 11:
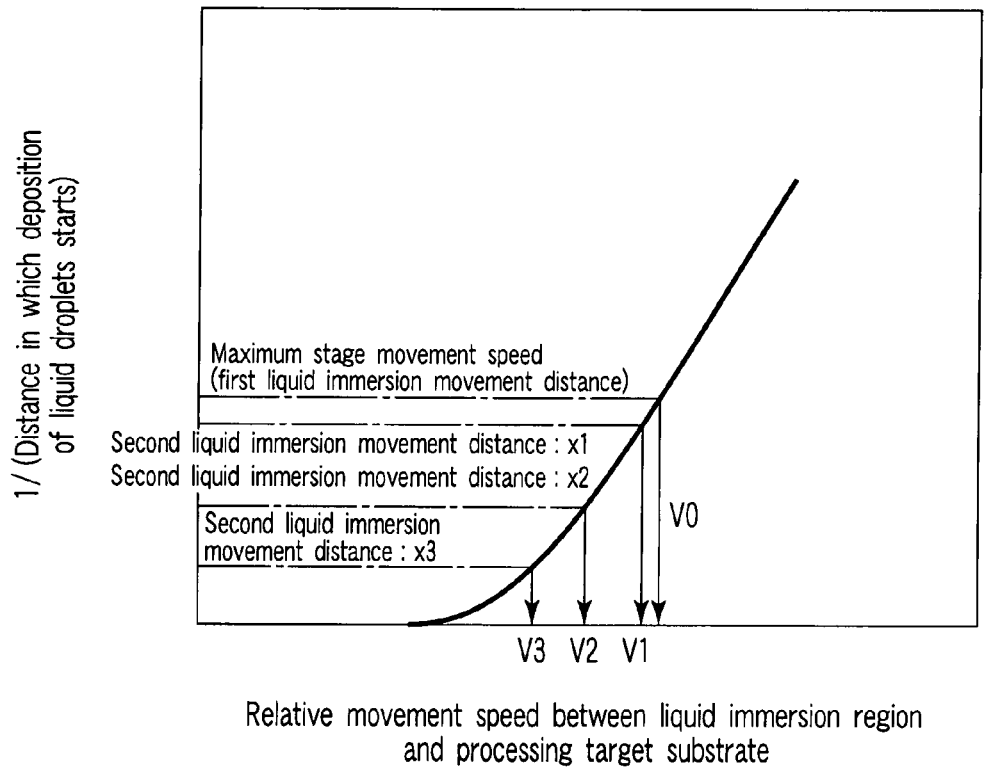
FIG. 11 is a view graphically depicting a method for determining a movement speed of second liquid immersion movement according to the first embodiment.

As described above, in the second liquid immersion movement process, as a relative movement distance between the wafer 5 and the liquid immersion region 12 increases, the movement speed of the wafer 5 (stage 6) is reduced, thereby making it possible to significantly reduce the residual liquid droplets that can cause a pattern defect. Desirably, as shown in FIG. 11, prior to carrying out the liquid immersion movement exposure process and the first and second liquid immersion movement processes, a relationship of the residual liquid droplet generation distance with respect to the relative movement speed between the wafer 5 and the liquid immersion region 12 is acquired in advance with respect to a substance on the surface 5a of the wafer 5. Then, relative movement speeds (v1, v2, v3<v0: first liquid immersion movement speed) at which the residual liquid droplets do not occur are determined with respect to movement distances (x1, x2, x3) in a variety of second liquid immersion movement processes, respectively. Thereafter, the processing of each second liquid immersion movement process is carried out. In this manner, the liquid immersion movement between the liquid immersion exposure regions 10 set on the surface 5a of the wafer 5 can be carried out in a good and proper state in which the residual liquid droplets hardly occur.

FIG. 11 is a view graphically depicting a method for determining a movement speed of second liquid immersion movement according to the present embodiment. That is, FIG. 11 graphically depicts a method of determining movement speed of the stage 6 in the second liquid immersion movement process in consideration of a relative movement distance between the wafer 5 and the liquid immersion region 12. In the case where a relative movement speed between the wafer 5 and the liquid immersion region 12 is maintained to be equal to or greater than a desired value at which the residual liquid droplets hardly occur, in the second liquid immersion movement process, it is preferable to calculate in advance a liquid droplet generation distance with respect to a desired speed in accordance with experiment or simulation prior to an actual liquid immersion exposure process. Then, based on the thus calculated liquid droplet generation distance, it is preferable to change a movement direction of the wafer 5 (stage 6) with respect to the liquid immersion head 4a (liquid immersion region 12) to a predetermined direction within the liquid droplet generation distance. According to such a method, most of the residual liquid droplets can be reliably eliminated.

As described above, in the present embodiment, the liquid film 11 is selectively formed between a surface of a resist film provided on a plurality of exposure regions 10 set on the surface 5a of the wafer 5 or a surface of a hydrophobic film formed on this resist film and the projection lens system 4 of the exposure apparatus 1. Then, pattern exposure is carried out passing through this liquid film 11. At this time, in a liquid immersion movement process for relatively moving the projection lens system 4 of the exposure apparatus 1 and the resist film or the hydrophobic film while the liquid film 11 is interposed therebetween, a movement speed of the stage 6 on which the wafer 5 is placed is adjusted to a speed such that liquid droplets do not remain on a surface of the resist film or hydrophobic film according to a distance in movement intervals. In this manner, liquid immersion exposure can be carried out while the liquid film (liquid) 11 is hardly left on the surface of the resist film or hydrophobic film. As a result, it becomes possible to prevent most of a risk that dimensional precision of a resist pattern is degraded by the residual liquid or a defect occurs in the resist pattern.

Specifically, as described previously, with respect to the movement speed of the stage 6 (wafer 5) in the liquid immersion movement process in which no exposure is carried out, the magnitude of the receding contact angle $\theta 1$ of the liquid immersion portion 11 is maintained to be equal to or greater than a lower limit of a receding contact angle at which liquid droplets remain. That is, the movement speed of the stage 6 in the second liquid immersion movement process is made lower than the movement speed of the stage 6 in the liquid immersion movement exposure process or the movement speed of the stage 6 in the first liquid immersion movement process. In this manner, most of the residual liquid droplets, which cause degradation of dimensional precision of a resist pattern or an occurrence of a defect in the resist pattern, can be prevented from occurring on the surface 5a of the wafer 5.

In addition, a case in which a relative movement distance between the wafer 5 (stage 6) and the liquid immersion region 12 (projection lens system 4) becomes a long distance at which the residual liquid droplets are likely to occur, is not always limited to movement at the time of evaluation of an alignment mark. For example, in the case of: movement of the liquid immersion region 12 from a standby position of the liquid immersion head 4a on the stage 6 set at the outside of the wafer 5 to a first exposure region 10 set on the surface 5a of the wafer 5; movement of the liquid immersion region 12 from a last exposure region 10 on the surface 5a of the wafer 5 to the standby position of the liquid immersion head 4a; or movement of the liquid immersion region 12 from a predetermined exposure region 10 on the surface 5a of the wafer 5 to a next exposure region 10, the movement being longer in distance than that in the liquid immersion movement exposure process, a relative movement of the liquid immersion region 12 with respect to the wafer 5 is a long distance movement in which the residual liquid droplets are likely to occur.

In any of these cases as well, of course, a technique of adjusting the movement speed of the stage 6 can be applied in order to prevent the occurrence of the residual liquid droplets described previously. In addition, it is not necessary to set the movement speed of the stage 6 at a speed at which the residual liquid droplets do not occur in the longest movement distance with respect to the whole liquid immersion movement process. Of course, with respect to a movement interval that is shorter than the longest movement distance, the movement speed of the stage 6 may be set to be higher than a speed at which the residual liquid droplets do not occur in the longest movement distance. In this manner, there is almost no risk that the residual liquid droplets occur and a liquid immersion exposure process with high throughput can be achieved. Finally, there can be provided a process of efficiently and easily manufacturing a semiconductor device with its improved performance, quality, and reliability at a high yield.

Further, although the present embodiment has described a case of forming on a resist film a hydrophobic film having dissolubility with respect to an alkaline developing solution, the film composition on the wafer 5 is not limited thereto. Of course, the technique according to the present embodiment can be applied to a case of forming on a resist film a hydrophobic film having dissolubility with respect to a solvent, a case where a resist film is very hydrophobic and a protective film which is slightly less hydrophobic than the resist film is formed on the resist film, or a case in which another film is not provided on a resist film (e.g., a case where use is made of a material that causes the hydrophobic components of resist to segregate in the surface of the resist film in the process of forming a resist coating film). In these cases as well, the movement speed of the liquid immersion region 12 (stage 6) in moving in a distance longer than an interval between the adjacent liquid immersion movement exposure regions 10 may be set at a speed lower than the movement speed of the liquid immersion region 12 between the adjacent liquid immersion movement exposure regions 10. In this manner, in the case where another film is not provided on the resist film as well, a risk that the residual liquid droplets occur on the wafer 5 can be significantly reduced.

As has been described above, according to the first embodiment, there can be provided a liquid immersion exposure method for carrying out exposure processing while the liquid 11 is locally (selectively) interposed in a region between the exposure target substrate 5 applied with exposure processing and the projection optical system 4 of the exposure apparatus 1, wherein throughput improvement of the exposure process can be promoted and there is almost no risk that the immersion liquid 11 remains on the exposure target substrate 5.

Second Embodiment

Figure 12:
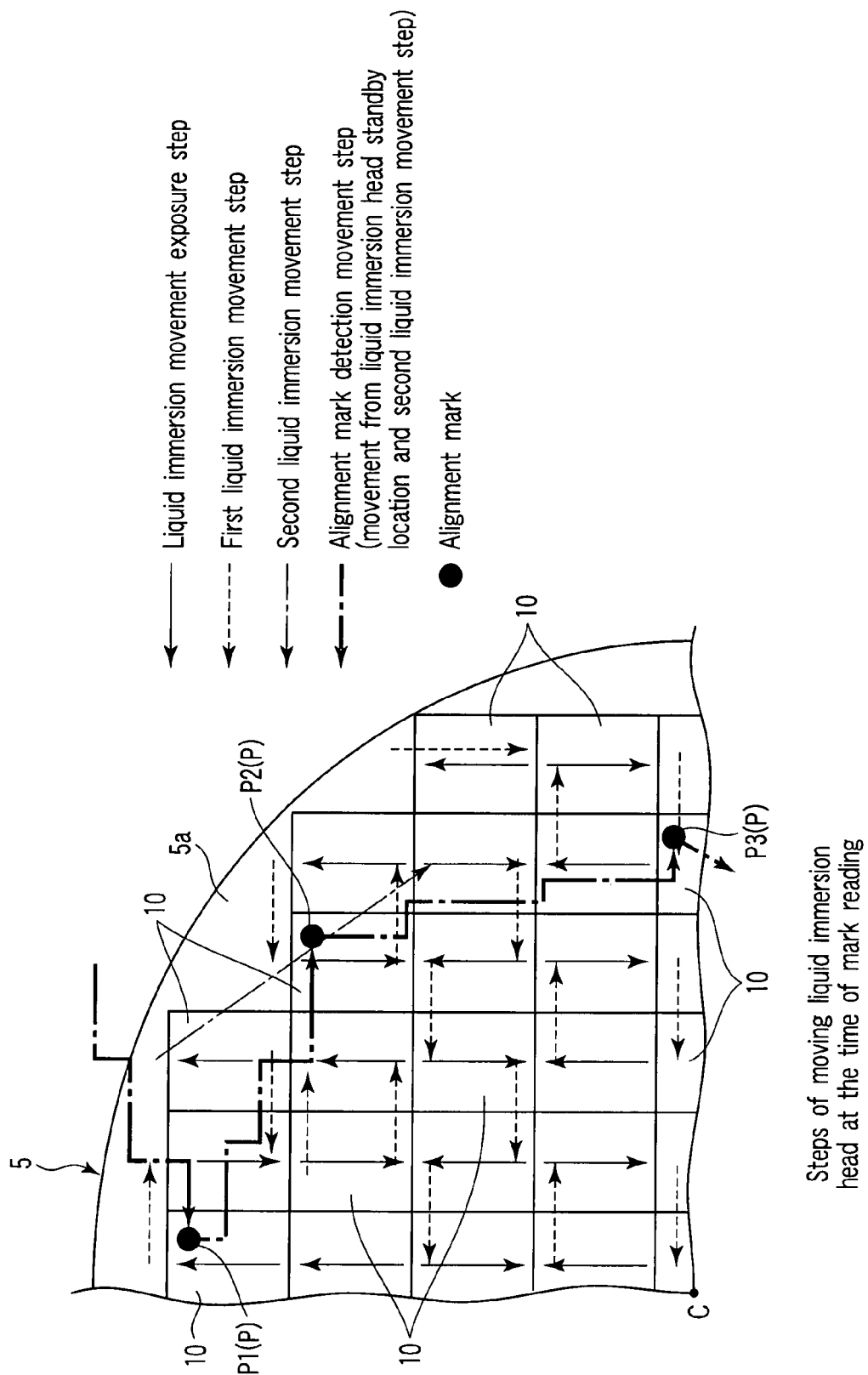
FIG. 12 is a plan view classifying, by type of movement, relative movement trajectory of a liquid immersion head with respect to a wafer according to a second embodiment.

Now, a second embodiment according to the present invention will be described with reference to FIG. 12. FIG. 12 is a plan view classifying, by type of movement, a relative movement trajectory of a liquid immersion head with respect to a wafer according to the present embodiment. Like constituent elements in the first embodiment described previously are designated by like reference numerals. A detailed description thereof is omitted here.

The present embodiment describes a technique of restricting an occurrence of the residual liquid droplets in accordance with a method that is different from that of the first embodiment. Specifically, in a second liquid immersion movement process, the longest movement distance in the same direction is calculated in consideration of a movement speed of a liquid immersion region 12 (stage 6), and the liquid immersion region 12 (stage 6) is moved in a zigzag manner so that the moving distance is equal to or smaller than the acceptable longest movement distance (limitation of the distance which deposition of fluid droplets starts). In this manner, the occurrence of the residual liquid droplets is restricted. Now, a specific description will be given below.

In order to maintain the movement speed of the liquid immersion region 12 in the second liquid immersion movement process to be equal to or greater than a value at which the residual liquid droplets described previously do not occur, for example, the movement direction of the liquid immersion region 12 may be changed at least one time at one residual liquid droplet generation distance. At this time, it is preferable to change the movement direction of the liquid immersion region 12 using at least one of three methods described later. The first method is a method for changing the movement direction of the liquid immersion region 12 in the range of 90° to 270° with respect to the previous movement direction. The second method is for changing the movement direction of the liquid immersion region 12 in a zigzag manner so that the movement trajectory of the liquid immersion region 12 becomes a continuous broken-line shape (zigzag chain shape). The third method is a method for gently changing the movement direction of the liquid immersion region 12 in a wobbling manner.

FIG. 12 shows a movement trajectory of the liquid immersion region 12 in the case of moving the liquid immersion region 12 at a speed equal to the movement speed of the liquid immersion region 12 in the first liquid immersion movement process and changing the movement direction of the liquid immersion region 12 at one movement interval at least one time, thereby carrying out the second liquid immersion movement process. More specifically, in the present embodiment, while the liquid immersion region 12 moves at a speed equal to the movement speed thereof in the first liquid immersion movement process, the second liquid immersion movement process is carried out by momentarily and gently changing a relative movement direction of the liquid immersion region 12 with respect to the wafer 5 by ±90° with respect to the previous movement direction, after the liquid immersion region 12 has moved almost the first liquid immersion movement distance. According to zigzag movement and wobbling movement experiments carried out·by the inventors, in such setting as well, a good result was successfully obtained such that the residual liquid droplets hardly occur.

Of course, a method for determining a movement speed in the liquid immersion region 12 (stage 6) in the second liquid immersion movement process using a relationship shown in FIG. 11 can be used similarly with respect to the determination of the movement speed of the liquid immersion region 12 in the first liquid immersion movement process.

As described above, according to the second embodiment, an advantageous effect similar to that of the first embodiment described previously can be attained. In addition, the movement direction of the liquid immersion region 12 in the second liquid immersion movement process is changed before a dynamic receding contact angle θ1 becomes a lower limit of a contact angle at which the liquid droplets remain. In this manner, a risk that the remaining liquid droplets occur on a surface 5a of a wafer 5 can be significantly reduced. Consequently, a risk that dimensional precision of a resist pattern deformations or a defect occurs in the resist pattern can be significantly reduced. Further, the performance, quality, reliability and the like of a semiconductor device can be improved by using a wafer 5 on which a resist pattern is formed by applying the technique according to the present embodiment. Concurrently, such a semiconductor device can be manufactured more efficiently and easily at a higher yield.

Third Embodiment

Figure 13:
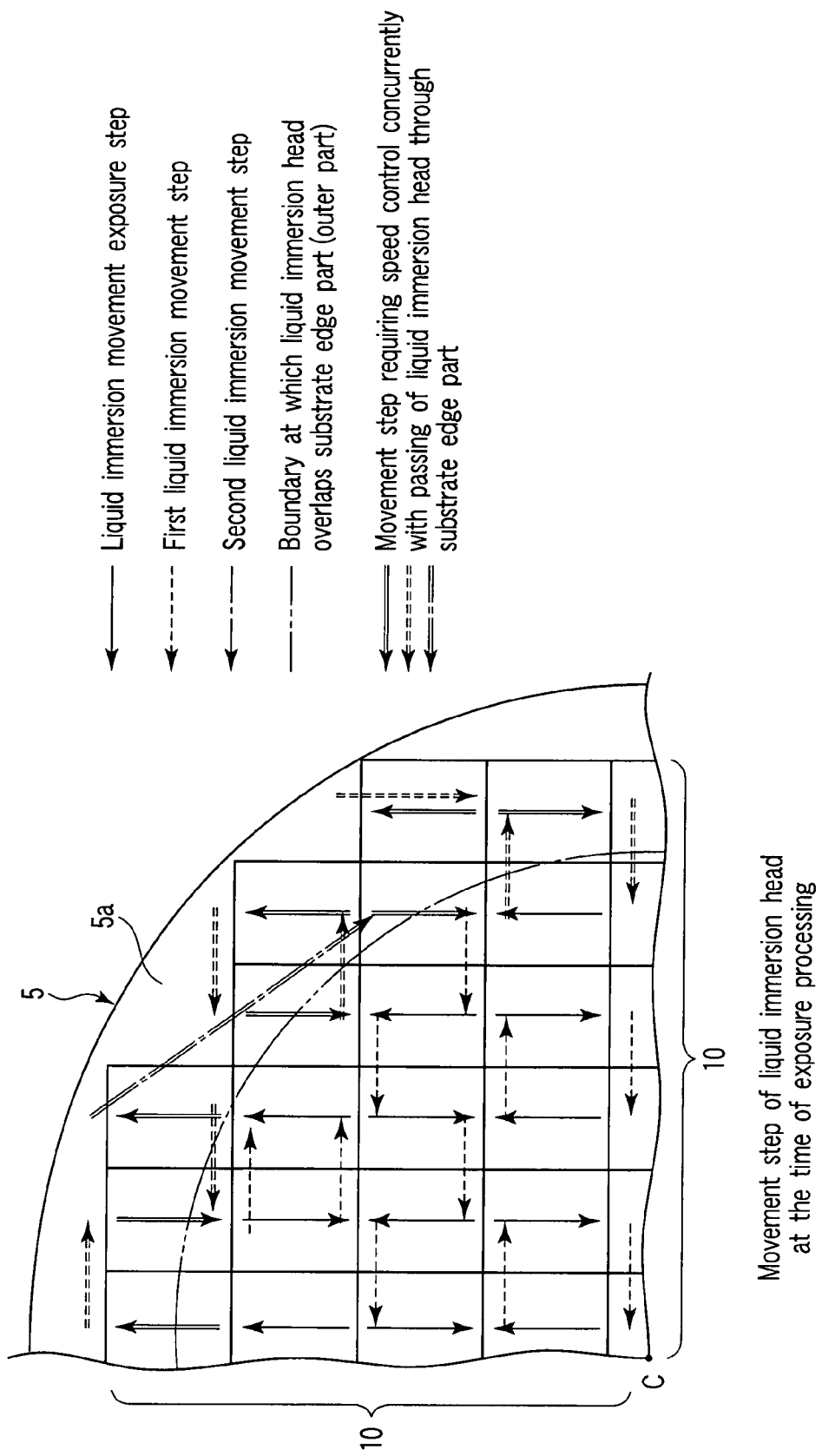
FIG. 13 is a plan view classifying, by type of movement, relative movement trajectory of a liquid immersion head with respect to a wafer according to a third embodiment.

Now, a third embodiment according to the present invention will be described with reference to FIG. 13. FIG. 13 is a plan view classifying, by type of movement, relative movement trajectory of a liquid immersion head with respect to a wafer according to a third embodiment. Like constituent elements in the first and second embodiments described previously are designated by like reference numerals. A detailed description thereof is omitted here.

The present embodiment describes a technique capable of restricting an occurrence of the remaining liquid droplets in the case where a liquid immersion region 12 passes through a rim part (outer rim part, edge part) 5b of a wafer 5 on which an exposure region 10 is not set, as well as a case in which the liquid immersion region 12 passes through the top of each exposure region 10. Specifically, when the liquid immersion region 12 passes through the edge part 5b of the wafer 5, a relative movement speed of the liquid immersion region 12 with respect to the wafer 5 is decelerated. Now, a specific description will be given below.

The step 101 (ST101) to the step 107 (ST107) are executed in the same manner as that in the first embodiment. The step 108 (ST108) is executed in a manner that is partially different from that of the first embodiment. Now, an exposure process (ST108) according to the present embodiment will be described below.

FIG. 13 shows only a fan-shaped region including a center part C and about ¼ of an outer periphery area, among a surface 5a of the wafer 5, as in FIG. 3 referred to in the first embodiment. In addition, FIG. 13 shows a relative movement trajectory of a center of each exposure region 10 set on the surface 5a of the wafer 5 and the liquid immersion region 12 with respect to the wafer 5. Further, FIG. 13 shows an example of a trajectory of carrying out limitation of a movement speed of the liquid immersion region 12 among the movement trajectory of the liquid immersion region 12 on the surface 5a of the wafer 5 in the present embodiment.

According to the experiments carried out by the inventors, it has been found that, when the outermost exposure region 10, among the exposure regions 10 on the surface 5a of the wafer 5, is liquid-immersed and exposed, the liquid immersion region 12 passes through the outer rim part (rim pat, edge part) 5b of the wafer 5 on which the exposure region 10 is not set. More specifically, it has been found that, in the case where a center part of the liquid immersion region 12 is positioned in a region that is more outside than the alternate double dot and chain line shown in FIG. 13, at least part of the liquid immersion region 12 overlaps an edge part 5b of the wafer 5.

Conventionally, if the liquid immersion region 12 passes through the edge part 5b of the wafer 5 on which the exposure region 10 is not set, distortion of a liquid caused by an edge shape occurs, and the residual liquid droplets easily occur. In order to avoid such a conventional problem, in the present embodiment, a relative movement speed of the liquid immersion region 12 with respect to the wafer 5 when a center part of the liquid immersion region 12 moves in a region outside the alternative double dot and chain line shown in FIG. 13 is made slower than a relative movement speed of the liquid immersion region 12 with respect to the wafer 5 when the center part of the liquid immersion region 12 moves in a region inside the alternate double dot and chain line shown in FIG. 13. That is, the relative movement speed of the liquid immersion region 12 with respect to the wafer 5 in the case where at least part of the liquid immersion region 12 overlaps the edge part 5b of the wafer 5 is made lower than the relative movement speed of the liquid immersion region 12 with respect to the wafer 5 in the case where the liquid immersion region 12 does not overlap the edge part 5b of the wafer 5.

According to the experiments carried out by the inventors, it was found that, if the relative movement speed of the liquid immersion region 12 with respect to the wafer 5 is controlled based on the setting described previously, most of the residual liquid droplets can be eliminated in every region on the surface 5a of the wafer 5 irrespective of whether or not the exposure region 10 exists. Concurrently, on each exposure region 10 among the surface 5a of the wafer 5, it was found that liquid immersion exposure can be carried out in a good and proper state in which no air bubbles enter the immersion liquid 11 (liquid immersion region 12).

In contrast, it was found that, in the case where the relative movement speed of the liquid immersion region 12 with respect to the wafer 5 in the case where the liquid immersion region 12 overlaps the edge part 5b of the wafer 5 was set at a speed equal to the relative movement speed of the liquid immersion region 12 with respect to the wafer 5 in the case where the liquid immersion region 12 does not overlap at the edge part 5b of the wafer 5, a distortion occurs with a liquid film 11 and liquid droplets remain on the surface 5a of the wafer 5. Then, it was found that surface roughness such as formation of water-marks on the surface 5a of the wafer 5 occurs due to the residual liquid droplets. In addition, it was found that there occurs a problem that the residual liquid droplets occur, whereby air bubbles are captured into the liquid film 11, and then, at the time of a pattern transfer, a pattern image quality deteriorates. Consequently, it was found that there frequently occurs a problem that dimensional precision of a resist pattern deformations or that a defect occurs in the resist pattern.

That is, according to a conventional liquid immersion exposure technique, it was found that there is a risk that the performance, quality, reliability and the like of a semiconductor device are extremely lowered. Concurrently, it was found that the manufacture yields and productivity of a semiconductor device may be extremely lowered.

A movement trajectory of the liquid immersion region 12 indicated by the double solid line arrow shown in FIG. 13 indicates an interval requiring speed control according to the present embodiment among the liquid immersion movement exposure process described in the first embodiment. Similarly, a movement trajectory of the liquid immersion region 12 indicated by the double dashed-line arrow shown in FIG. 13 indicates an interval requiring speed control according to the present embodiment among the first liquid immersion movement process. In addition, similarly, a movement trajectory of the liquid immersion region 12 indicated by the alternate single-dot and chain line arrow shown in FIG. 13 indicates an interval requiring speed control according to the present invention among second liquid immersion movement process.

After the step 108 (ST108) has been executed by the setting described above, the routine goes to the step 109A (ST109A) or the step 109B (ST109B). Then, the step 109A (step 109B) to the step 112 (ST112) are similar to those of the first embodiment.

Although a detailed and specific description with illustration is not given here, as in the first embodiment, the inventors applied processing such as forming a wiring pattern with respect to the wafer 5 produced through each of the processes described previously. As a result, as in the first embodiment, a defect caused by a liquid immersion movement process, such as a pattern short-circuit, was not found. In addition, since the residual liquid droplets do not permeate a resist film, a wiring pattern with its good dimensional precision was successfully obtained as compared with a case of using conventional liquid immersion exposure. That is, according to the present embodiment, as in the first embodiment, it was found to be possible to provide a semiconductor device having high device reliability, quality, performance and the like as compared with those of a semiconductor device according to a conventional technique. That is, it was found that such a semiconductor device can be manufactured efficiently and easily at a high yield. That is, as described previously, it was found that, when part of a liquid film 11 selectively provided on a surface 5a of the wafer 5 passes through an edge part 5b of the wafer 5, a movement speed of the wafer 5 (stage 6) is decelerated, thereby making it possible to achieve a liquid immersion exposure process (semiconductor manufacturing process) with a low defect rate.

As has been described above, according to the third embodiment, the movement speed of the wafer 5 with respect to the projection lens system 4 in the case where the liquid immersion region 12 is positioned on the edge part 5b of the wafer 5 is set to be lower than the movement speed of the wafer 5 with respect to the projection lens system 4 in the case where the liquid immersion region 12 is positioned at a part other than the edge part 5b of the wafer 5, whereby an advantageous effect similar to that of each of the first and second embodiments described previously can be attained.

The liquid immersion exposure method according to the present invention is not limited to each of the first to third embodiments described previously. This exposure method can be carried out without departing from the spirit of the invention by changing part of the configuration or manufacturing process to various settings or properly using and combining various settings.

For example, while each of the first to third embodiments has described a case of providing a resist film on a surface 5a of a wafer 5 that is one main face of the wafer (exposure target substrate) 5, it is not always necessary to provide the resist film on the surface 5a of the wafer 5. The liquid immersion exposure processing described previously may be directly applied to the surface 5a of the wafer 5. With such a method as well, of course, an advantageous effect similar to that of each of the first to third embodiments can be attained.

In addition, while each of the first to third embodiments has described a case of providing a resist film on the surface 5a of the wafer 5, and further, providing a hydrophobic liquid immersion exposure protective film while this resist film is covered, it is not always necessary to provide the resist film on the surface 5a of the wafer 5. That is, in the case where a strongly hydrophobic resist film is employed as a resist film, it is not necessary to provide the hydrophobic liquid immersion exposure protective film on the resist film. In this case, the liquid immersion exposure processing described above may be directly applied to a surface of the resist film. With such a method as well, of course, an advantageous effect similar to that of each of the first to third embodiments can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of a semiconductor device comprising:

a liquid immersion movement exposure of interposing a liquid between an exposure target substrate applied with exposure processing and a projection optical system of an exposure apparatus which carries out the exposure processing, and carrying out the exposure processing with respect to a plurality of exposure regions set on a surface of the exposure target substrate while relatively moving the exposure target substrate with respect to the projection optical system;

a first liquid immersion movement of relatively moving the exposure target substrate with respect to the projection optical system without carrying out the exposure processing while interposing the liquid between the exposure target substrate and the projection optical system, in adjacent exposure regions of said each exposure region; and a second liquid immersion movement of relatively moving the exposure target substrate with respect to the projection optical system at a speed lower than a movement speed in the first liquid immersion movement, without carrying out the exposure processing, while interposing the liquid between the exposure target substrate and the projection optical system, in a distance that is longer than a movement distance in the first liquid immersion movement.

2. The method according to claim 1, wherein the relative movement speed of the exposure target substrate with respect to the projection optical system in the second liquid immersion movement is lower than a speed at which the liquid remains on the exposure target substrate at the time of movement of the exposure target substrate.

3. The method according to claim 1, wherein the relative movement speed of the exposure target substrate with respect to the projection optical system in the liquid immersion movement exposure is lower than a speed at which the liquid remains on the exposure target substrate at the time of movement of the exposure target substrate.

4. The method according to claim 1, further comprising: providing a resist film on a main face at an exposure side of the exposure target substrate.

5. The method according to claim 4, further comprising: providing a film that is more hydrophobic than the resist film on the resist film, or causing hydrophobic components to segregate in a surface region of the resist film during formation of the resist film such that the resist film has a hydrophobic surface.

6. A manufacturing method of a semiconductor device comprising:
  a liquid immersion movement exposure of interposing a liquid between an exposure target substrate applied with exposure processing and a projection optical system of an exposure apparatus which carries out the exposure processing, and carrying out the exposure processing with respect to a plurality of exposure regions set on a surface of the exposure target substrate while relatively moving the exposure target substrate with respect to the projection optical system;
  a first liquid immersion movement of relatively moving the exposure target substrate with respect to the projection optical system without carrying out the exposure processing while interposing the liquid between the exposure target substrate and the projection optical system, in adjacent exposure regions of said each exposure region; and
  a second liquid immersion movement of relatively moving the exposure target substrate with respect to the projection optical system without carrying out the exposure processing while interposing the liquid between the exposure target substrate and the projection optical system, in a distance that is longer than a movement distance in the first liquid immersion movement, and changing at least one of a movement speed and a movement direction of the exposure target substrate with respect to the projection optical system before residual liquid occurs on the exposure target substrate;
  wherein, in the second liquid immersion movement, the relative movement direction of the exposure target substrate with respect to the protection optical system is set such that a movement trajectory of the exposure target substrate is formed in a broken-line shape or in a wobbling shape.

7. The method according to claim 6, wherein, in the second liquid immersion movement, the relative movement direction of the exposure target substrate with respect to the projection optical system is changed in the range of 90° to 270° with respect to a previous movement direction of the exposure target substrate.

8. The method according to claim 6, wherein the relative movement speed of the exposure target substrate with respect to the projection optical system in the second liquid immersion movement is lower than a speed at which the liquid remains on the exposure target substrate at the time of movement of the exposure target substrate.

9. The method according to claim 6, wherein the relative movement speed of the exposure target substrate with respect to the projection optical system in the liquid immersion movement exposure is lower than a speed at which the liquid remains on the exposure target substrate at the time of movement of the exposure target substrate.

10. The method according to claim 6, further comprising: providing a resist film on a main face at an exposure side of the exposure target substrate.

11. The method according to claim 10, further comprising: providing a film that is more hydrophobic than the resist film on the resist film, or causing hydrophobic components to segregate in a surface region of the resist film during formation of the resist film such that the resist film has a hydrophobic surface.

12. A manufacturing method of a semiconductor device comprising:
  a liquid immersion movement exposure of interposing a liquid between an exposure target substrate applied with exposure processing and a projection optical system of an exposure apparatus which carries out the exposure processing, and carrying out the exposure processing with respect to a plurality of exposure regions set on a surface of the exposure target substrate while relatively moving the exposure target substrate with respect to the projection optical system,
  wherein a movement speed of the exposure target substrate with respect to the projection optical system in the case where the liquid is positioned on a rim part of the exposure target substrate is set to be lower than a movement speed of the exposure target substrate with respect to the projection optical system in the case where the liquid is position at a part other than the rim part of the exposure target substrate;
  further comprising:
  a first liquid immersion movement of relatively moving the exposure target substrate with respect to the projection optical system without carrying out the exposure processing while interposing the liquid between the exposure target substrate and the projection optical system, in adjacent exposure regions of said each exposure region; and
  a second liquid immersion movement of relatively moving the exposure target substrate with respect to the projection optical system at a speed lower than a movement speed in the first liquid immersion movement, without carrying out the exposure processing, while interposing the liquid between the exposure target substrate and the projection optical system, in a distance that is longer than a movement distance in the first liquid immersion movement.

13. The method according to claim 12, further comprising:
  a first liquid immersion movement of relatively moving the exposure target substrate with respect to the projection optical system without carrying out the exposure processing while interposing the liquid between the exposure target substrate and the projection optical system, in adjacent exposure regions of said each exposure region; and a second liquid immersion movement of relatively moving the exposure target substrate with respect to the projection optical system without carrying out the exposure processing while interposing the liquid between the exposure target substrate and the projection optical system, in a distance that is longer than a movement distance in the first liquid immersion movement, and changing at least one of a movement speed and a movement direction of the exposure target substrate with respect to the projection optical system before residual liquid occurs on the exposure target substrate.

14. The method according to claim 12, wherein the relative movement of the exposure target substrate with respect to the projection optical system in the liquid immersion movement exposure is lower than a speed at which the liquid remains on the exposure target substrate at the time of movement of the exposure target substrate.

15. The method according to claim 12, further comprising: providing a resist film on a main face at an exposure side of the exposure target substrate.

16. The method according to claim 15, further comprising: providing a film that is more hydrophobic than the resist film on the resist film, or causing hydrophobic components to segregate in a surface region of the resist film during formation of the resist film such that the resist film has a hydrophobic surface.

17. The method according to claim 12, wherein the relative movement of the exposure target substrate with respect to the projection optical system in the second liquid immersion movement exposure is lower than a speed at which the liquid remains on the exposure target substrate at the time of movement of the exposure target substrate.

18. The method according to claim 13, wherein the relative movement of the exposure target substrate with respect to the projection optical system in the second liquid immersion movement exposure is lower than a speed at which the liquid remains on the exposure target substrate at the time of movement of the exposure target substrate.

* * * * *

UNITED STATES PATENT AND TRADEMARK OFFICE
CERTIFICATE OF CORRECTION

PATENT NO. : 7,742,150 B1  
APPLICATION NO. : 11/654566  
DATED : June 22, 2010  
INVENTOR(S) : Ito et al.

Page 1 of 1

It is certified that error appears in the above-identified patent and that said Letters Patent is hereby corrected as shown below:

Claim 6, column 23, line 61, change "protection" to --projection--.

Claim 12, column 24, line 45, change "position at" to --positioned at--.

Signed and Sealed this  
Eighth Day of March, 2011

David J. Kappos  
*Director of the United States Patent and Trademark Office*